(12) United States Patent
Sawada

(10) Patent No.: US 11,990,373 B2
(45) Date of Patent: *May 21, 2024

(54) METHOD FOR PRODUCING SEMICONDUCTOR DEVICE, SEMICONDUCTOR PACKAGE, AND METHOD FOR PRODUCING SEMICONDUCTOR PACKAGE

(71) Applicant: SOCIONEXT INC., Kanagawa (JP)

(72) Inventor: Toyoji Sawada, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/176,143

(22) Filed: Feb. 28, 2023

(65) Prior Publication Data

US 2023/0207391 A1   Jun. 29, 2023

Related U.S. Application Data

(62) Division of application No. 17/383,162, filed on Jul. 22, 2021, now Pat. No. 11,621,193.

(30) Foreign Application Priority Data

Jul. 28, 2020 (JP) ................................. 2020-127200

(51) Int. Cl.
   *H01L 21/78* (2006.01)
   *H01L 21/268* (2006.01)
   (Continued)

(52) U.S. Cl.
   CPC ............ *H01L 21/78* (2013.01); *H01L 21/268* (2013.01); *H01L 21/4853* (2013.01);
   (Continued)

(58) Field of Classification Search
   CPC ... H01L 21/78; H01L 21/268; H01L 21/4853; H01L 21/563; H01L 22/32;
   (Continued)

(56) References Cited

U.S. PATENT DOCUMENTS 6,124,143 A   9/2000 Sugasawara
6,291,835 B1 * 9/2001 Tsuji ....................... H01L 22/34
                                                        257/692

(Continued)

FOREIGN PATENT DOCUMENTS

JP    2008-078382 A    4/2008
JP    2010-129970 A    6/2010
(Continued)

OTHER PUBLICATIONS

Non-Final Office Action dated Oct. 6, 2022 issued in U.S. Appl. No. 17/383,162.

(Continued)

*Primary Examiner* — Vu A Vu
(74) *Attorney, Agent, or Firm* — Rimon P.C.

(57) ABSTRACT

A method for producing a semiconductor device includes dicing, at a scribe area of a semiconductor wafer, the semiconductor wafer into semiconductor chips including respective circuit areas formed on the semiconductor wafer, the scribe area being provided between the circuit areas and extending in a first direction in a plan view, wherein the scribe area includes a first area extending in the first direction and second areas including monitor pads and extending in the first direction and located on both sides of the first area, wherein the method includes removing at least portions of the monitor pads by emitting laser beam to the second areas before the dicing, and wherein, in the dicing, the semiconductor wafer is diced at the first area.

19 Claims, 21 Drawing Sheets

(51) Int. Cl.
  *H01L 21/48* (2006.01)
  *H01L 21/56* (2006.01)
  *H01L 21/66* (2006.01)
  *H01L 23/00* (2006.01)
  *H01L 23/31* (2006.01)
  *H01L 23/544* (2006.01)

(52) U.S. Cl.
  CPC ............ *H01L 21/563* (2013.01); *H01L 22/32* (2013.01); *H01L 23/3185* (2013.01); *H01L 23/544* (2013.01); *H01L 24/16* (2013.01); *H01L 2223/5446* (2013.01); *H01L 2224/16225* (2013.01); *H01L 2924/18161* (2013.01); *H01L 2924/35121* (2013.01)

(58) Field of Classification Search
  CPC ... H01L 23/3185; H01L 23/544; H01L 24/16; H01L 2223/5446; H01L 2224/16225; H01L 2924/18161; H01L 2924/35121; H01L 23/3142; H01L 24/83; H01L 24/13; H01L 24/73; H01L 24/81; H01L 24/92; H01L 2224/83897; H01L 24/32; H01L 2224/13101; H01L 2224/32225; H01L 2224/73204; H01L 2224/81801; H01L 2224/92125; H01L 2924/10157; H01L 2924/15311; H01L 2924/18301
  USPC ......................................................... 257/668
  See application file for complete search history.

(56) References Cited

U.S. PATENT DOCUMENTS

| | | | | |
|---|---|---|---|---|
| 7,482,675 B2* | 1/2009 | Adkisson | ................. | H01L 24/06 257/620 |
| 7,952,167 B2* | 5/2011 | Lee | ................... | H01L 23/585 257/E21.523 |
| 8,513,776 B2* | 8/2013 | Otsuka | ................... | H01L 21/78 257/618 |
| 8,791,574 B2* | 7/2014 | Akiba | ................... | B28D 5/022 257/773 |
| 8,937,009 B2* | 1/2015 | Daubenspeck | ......... | H01L 24/11 438/18 |
| 9,406,625 B2* | 8/2016 | Wang | ...................... | H01L 21/78 |
| 10,297,520 B2* | 5/2019 | Narita | ................ | H01L 23/3171 |
| 10,665,557 B2* | 5/2020 | Han | ...................... | H01L 23/562 |
| 10,910,270 B2* | 2/2021 | Choi | .................. | H01L 21/3043 |
| 11,621,193 B2* | 4/2023 | Sawada | ................... | H01L 24/16 257/668 |
| 2005/0176168 A1* | 8/2005 | Yee | ......................... | H01L 24/97 257/116 |
| 2008/0073780 A1 | 3/2008 | Imori | | |
| 2009/0121337 A1 | 5/2009 | Abe et al. | | |
| 2010/0133659 A1 | 6/2010 | Hara et al. | | |
| 2010/0291718 A1 | 11/2010 | Hiratsuka | | |
| 2014/0213043 A1 | 7/2014 | Van der Stam | | |
| 2020/0312715 A1* | 10/2020 | Choi | ..................... | H01L 24/03 |

FOREIGN PATENT DOCUMENTS

| | | | |
|---|---|---|---|
| JP | 2010-267795 | A | 11/2010 |
| JP | 2011-035302 | A | 2/2011 |
| JP | 2013-247217 | A | 12/2013 |
| JP | 2014-223677 | A | 12/2014 |
| JP | 2016-134427 | A | 7/2016 |
| WO | 2007/055010 | A1 | 5/2007 |

OTHER PUBLICATIONS

Notice of Allowance dated Dec. 14, 2022 issued in U.S. Appl. No. 17/383,162.

Japanese Office Action dated Feb. 27, 2024 issued in the corresponding Japanese Patent Application No. 2020-127200, with English machine translation.

* cited by examiner

METHOD FOR PRODUCING SEMICONDUCTOR DEVICE, SEMICONDUCTOR PACKAGE, AND METHOD FOR PRODUCING SEMICONDUCTOR PACKAGE

CROSS-REFERENCE TO RELATED APPLICATION

This application is a Divisional of U.S. patent application Ser. No. 17/383,161 filed on Jul. 22, 2021, now U.S. Pat. No. 11,621,193, which in turn claims priority to Japanese Patent Application No. 2020-127200, filed Jul. 28, 2020. The entire disclosures of these applications are incorporated by reference herein.

FIELD

The present disclosure relates to a method for producing a semiconductor device, a semiconductor package, and a method for producing the semiconductor package.

BACKGROUND

When a semiconductor device is produced, multiple circuit areas are provided on the semiconductor wafer, and a scribe area is provided between neighboring circuit areas. Then, at the scribe area, the semiconductor wafer is diced into multiple semiconductor chips with a dicing blade.

The diced semiconductor chips are flip-chip mounted on or over a printed circuit board, and an underfill is provided between the printed circuit board and the semiconductor chip.

SUMMARY

According to an aspect of an embodiment of the present disclosure, a method for producing a semiconductor device, the method includes:
  dicing, at a scribe area, a semiconductor wafer into a plurality of semiconductor chips each including at least one of a plurality of circuit areas, the semiconductor wafer including the plurality of circuit areas and the scribe area provided between neighboring circuit areas of the plurality of circuit areas, the scribe area extending in a first direction in a plan view,
  wherein the scribe area includes:
    a first area extending in the first direction; and
    second areas located on both sides of the first area in a second direction perpendicular to the first direction in the plan view, the second areas extending in the first direction, monitor pads being provided in the second areas,
  wherein the method includes:
    before the dicing of the semiconductor wafer into the plurality of semiconductor chips, removing at least portions of the monitor pads by emitting laser beam to the second areas, and
  wherein, in the dicing of the semiconductor wafer into the plurality of semiconductor chips, the semiconductor wafer is diced at the first area.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

Figure 1:
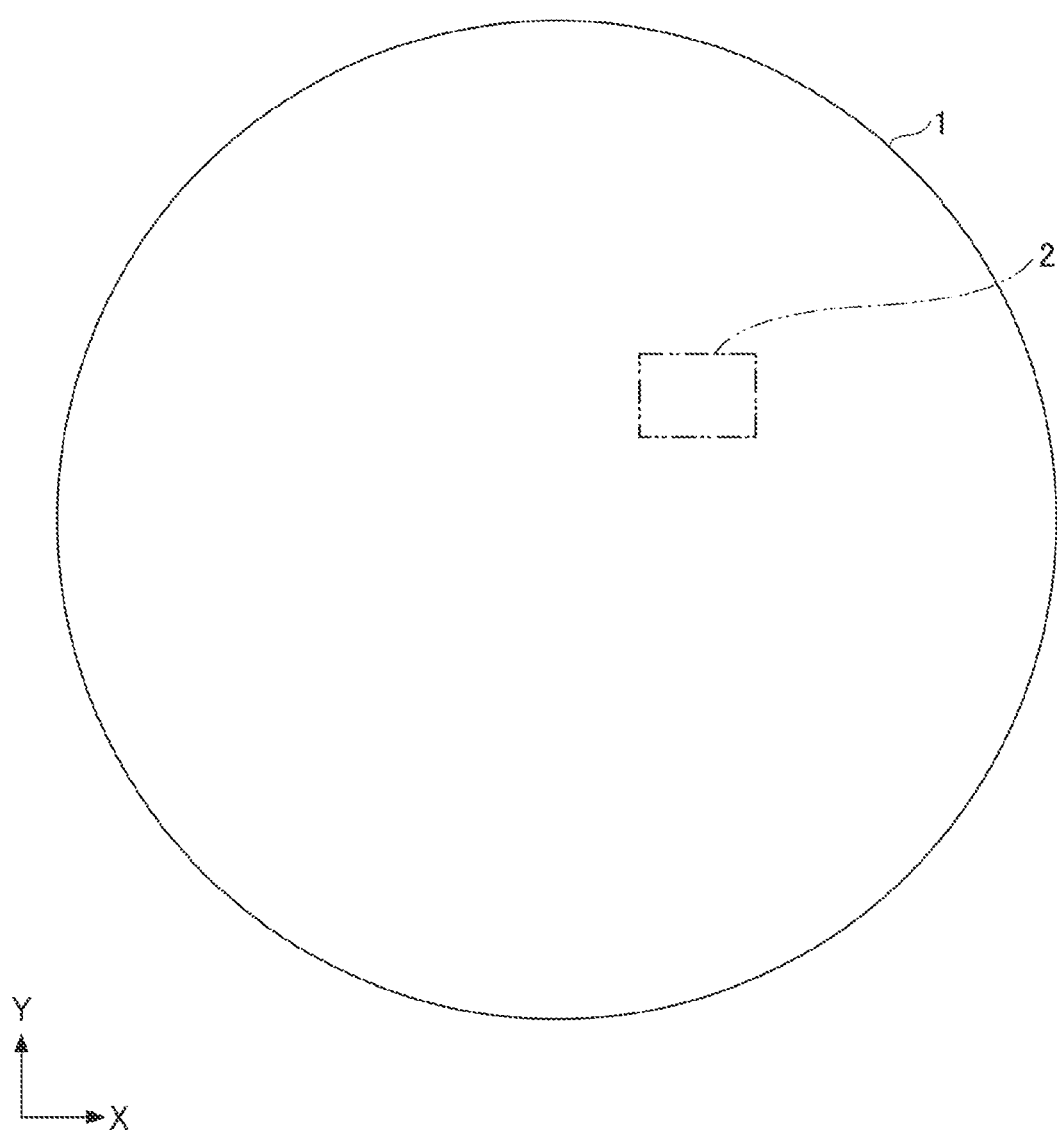
FIG. 1 is a drawing illustrating a semiconductor wafer used in a first embodiment.

When a semiconductor device is produced, multiple circuit areas are provided on the semiconductor wafer, and a scribe area is provided between neighboring circuit areas. Then, at the scribe area, the semiconductor wafer is diced into multiple semiconductor chips with a dicing blade.

The diced semiconductor chips are flip-chip mounted on or over a printed circuit board, and an underfill is provided between the printed circuit board and the semiconductor chip. See Japanese Laid-open Patent Publication No. 2010-129970, Japanese Laid-open Patent Publication No. 2010-267795, Japanese Laid-open Patent Publication No. 2011-035302, Japanese Laid-open Patent Publication No. 2014-223677, and Japanese Laid-open Patent Publication No. 2016-134427.

With such a semiconductor device manufactured using a conventional semiconductor chip, peeling may occur between the semiconductor chip and the underfill.

Accordingly, it is desired to provide a method for producing a semiconductor device, a semiconductor package, and a method for producing a semiconductor package that can reduce peeling of the underfill.

Hereinafter, embodiments are specifically described with reference to the attached drawings. In the specification and the drawings of the present application, constituent elements having substantially the same functional configurations may be denoted by the same reference numerals, and redundant explanations thereabout may be omitted. In the following explanation, the two directions that are parallel to the surface of the substrate and that are orthogonal to each other are referred to as the X direction and the Y direction, and the direction perpendicular to the surface of the substrate is referred to as the Z direction. Also, a drawing illustrating a surface extending in the X and Y directions as seen from the Z direction may be referred to as a plan view.

First Embodiment

First, the first embodiment is explained. The first embodiment relates to a method for producing a semiconductor device. FIG. 1 is a drawing illustrating a semiconductor wafer used in the first embodiment. FIG. 2 to FIG. 5 are schematic diagrams illustrating the method for producing a semiconductor device according to the first embodiment. FIG. 6 to FIG. 9 are cross-sectional views illustrating the method for producing a semiconductor device according to the first embodiment. FIG. 2 to FIG. 5 are enlarged drawings illustrating an area 2 that is a portion of FIG. 1. FIG. 6 to FIG. 9 are cross-sectional views taken along line VI-VI to line IX-IX in FIG. 2 to FIG. 5, respectively.

In the method for producing a semiconductor device according to the first embodiment, a semiconductor wafer including multiple circuit areas and a scribe area having monitor pads is prepared, and the semiconductor wafer is diced at the scribe area, so that multiple semiconductor chips including respective circuit areas are formed.

Figure 2:
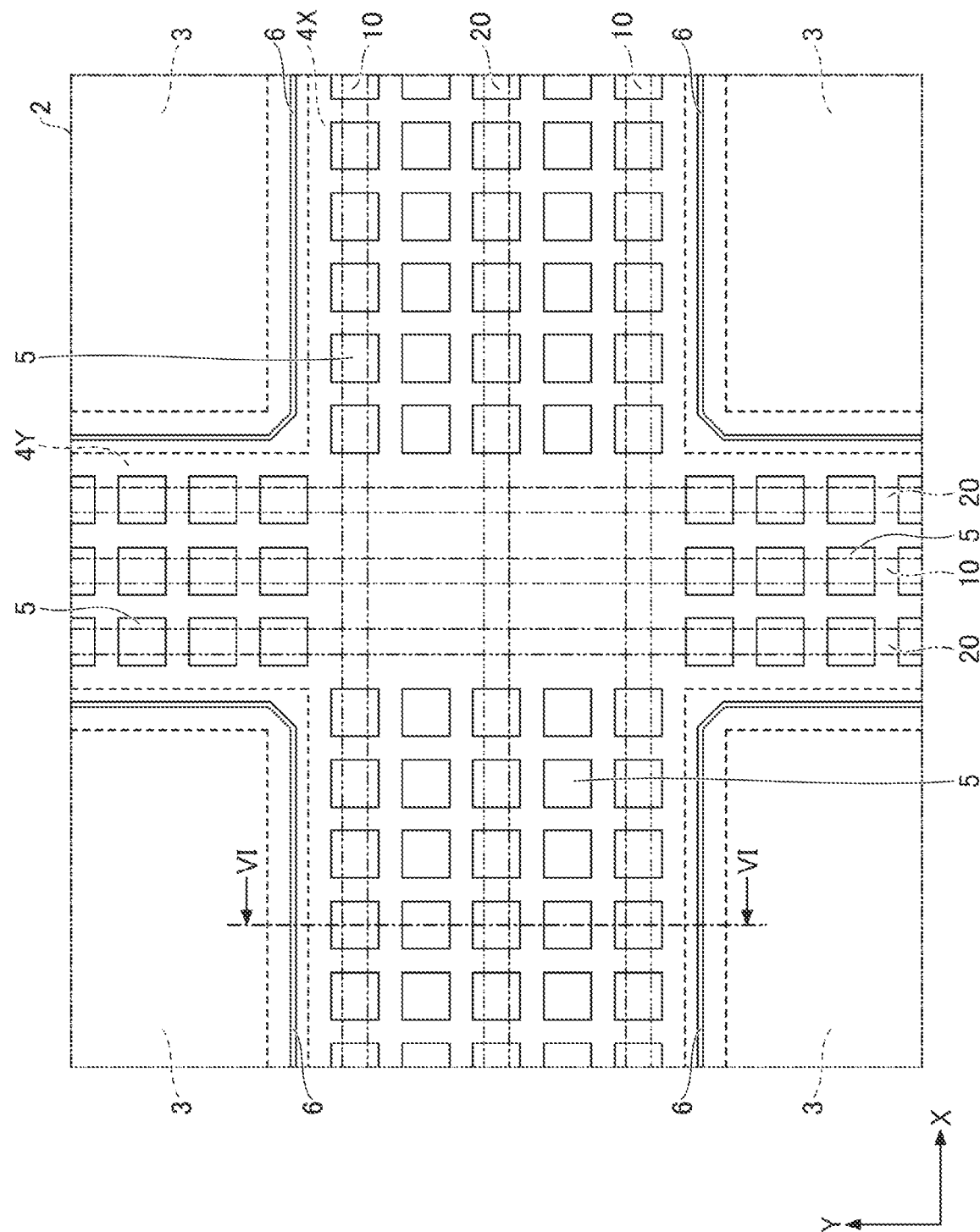
FIG. 2 is a schematic diagram (Part 1) illustrating a method for producing a semiconductor device according to the first embodiment.

First, the semiconductor wafer is explained in detail. As illustrated in FIG. 1 and FIG. 2, the semiconductor wafer 1 used in the first embodiment includes multiple circuit areas 3 arranged in the X direction and the Y direction. A scribe area 4Y extending in the Y direction is provided between circuit areas 3 neighboring with each other in the X direction, and a scribe area 4X extending in the X direction is provided between circuit areas 3 neighboring with each other in the Y direction. A seal ring 6 is provided between the circuit areas 3 and the scribe areas 4X and 4Y.

Monitor patterns (not illustrated) are provided in the scribe areas 4X and 4Y, and the monitor pads 5 connected to the monitor patterns are provided on the front surface of the scribe areas 4X and 4Y. For example, when the X direction is referred to as a row direction, and the Y direction is referred to as a column direction, in the scribe area 4X, multiple monitor pads 5 are arranged so as to constitute a matrix including 5 rows and N columns (N is a natural number), and in the scribe area 4Y, multiple monitor pads 5 are arranged so as to constitute a matrix including M rows (M is a natural number) and 3 columns.

Figure 6:
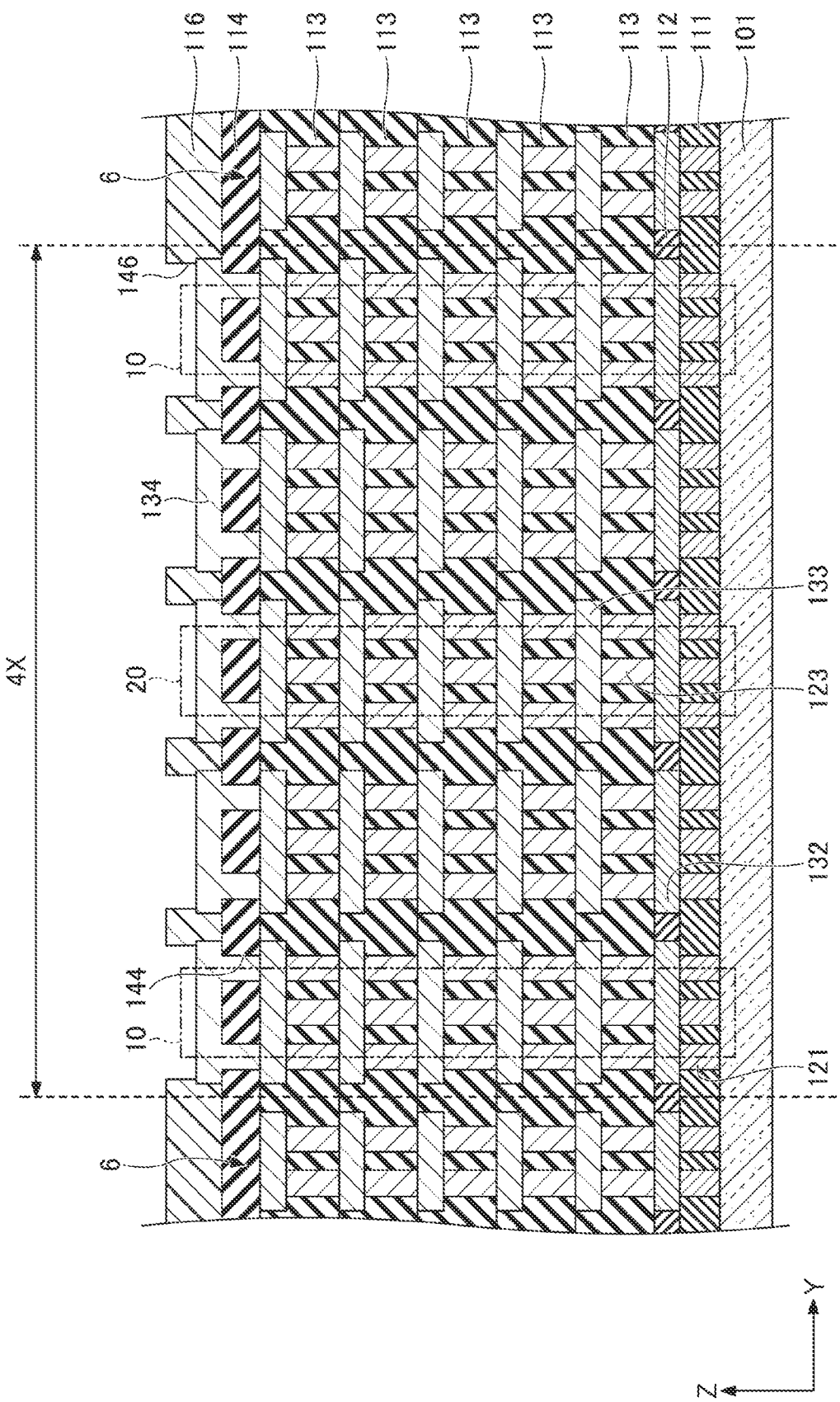
FIG. 6 is a cross-sectional view (Part 1) illustrating the method for producing a semiconductor device according to the first embodiment.

Hereinafter, the configuration of the scribe area 4X is explained. As illustrated in FIG. 6, a first interlayer insulating film 111 is formed on a substrate 101 such as a silicon substrate. Vias 121 are formed in the first interlayer insulating film 111. For example, the first interlayer insulating film 111 is a film such as silicon carbide acid (SiOC), silicon oxynitride (SiON), or silicon oxide (SiO$_2$) For example, the via 121 is a film such as tungsten (W), ruthenium (Ru), molybdenum (Mo) or cobalt (Co), and an underlayer film such as titanium (Ti) or titanium nitride (TiN) formed under this film.

Second interlayer insulating films 112 are formed on the first interlayer insulating film 111. A conductive trace film 132 is formed in the second interlayer insulating film 112. For example, the second interlayer insulating film 112 is a film such as silicon carbide acid (SiOC), silicon oxynitride (SiON), or silicon oxide (SiO$_2$). For example, the conductive trace film 132 includes a film such as copper (Cu) or ruthenium (Ru) and an underlayer film such as titanium (Ti), titanium nitride (TiN), tantalum (Ta), or tantalum nitride (TaN) formed under this film. In a case where the material of the conductive trace film 132 is ruthenium (Ru), the formation of the underlayer film may be omitted.

Multiple third interlayer insulating films 113 are formed on the second interlayer insulating film 112. Vias 123 and a conductive trace film 133 are formed in the third interlayer insulating film 113. The conductive trace film 133 is formed on the vias 123, and the conductive trace film 133 and the vias 123 have a dual damascene structure. The vias 123 are connected to the conductive trace film 132 immediately under the vias 123 or to the conductive trace film 133. For example, the third interlayer insulating film 113 is a film such as silicon carbide acid (SiOC), silicon oxynitride (SiON), or silicon oxide (SiO$_2$) For example, the conductive trace film 133 and the vias 123 are a film such as copper (Cu) or ruthenium (Ru) and an underlayer film such as titanium (Ti), titanium nitride (TiN), tantalum (Ta), or tantalum nitride (TaN) formed under this film. In a case where the conductive trace film 133 is made of ruthenium (Ru), it is not necessary to form the underlayer film.

A fourth interlayer insulating film 114 is formed on the uppermost third interlayer insulating film 113 of the multiple third interlayer insulating films 113. A conductive film 134 is formed on the fourth interlayer insulating film 114. Via holes 144 are formed in the fourth interlayer insulating film 114, and the conductive film 134 is connected to the conductive trace film 133 through the via holes 144. A cover film 116 is formed on the fourth interlayer insulating film 114 and the conductive film 134. In the cover film 116, an opening portion 146 is formed to expose a portion of the conductive film 134. The opening portion 146 has a rectangular planar shape including two sides parallel to the X direction and two sides parallel to the Y direction. For example, the fourth interlayer insulating film 114 is a film such as a silicon oxide (SiO$_2$). For example, the conductive film 134 is a film such as aluminum (Al).

Although not illustrated in FIG. 6, the monitor patterns are provided in the scribe area 4X, and the conductive film 134 is connected to the monitor patterns. A portion of the conductive film 134 that is exposed from the opening portion 146 serves as one of the monitor pads 5, and an electrical characteristics test using the monitor patterns is conducted through the monitor pads 5.

In the scribe area 4X, five opening portions 146 are arranged in the Y direction, and five monitor pads 5 are also arranged in the Y direction. In the scribe area 4X, a group of monitor pads 5 in five rows are arranged in the Y direction. The scribe area 4X includes: two groove formation areas 10 that overlap with the outermost rows of the group of five rows; and one dicing area 20 that overlaps with the central row of the group of five rows. The groove formation areas 10 and the dicing area 20 extend in the X direction. The width of the groove formation area 10 is generally equal to the spot diameter of laser beam emitted later. The width of the dicing area 20 is generally equal to the thickness of the dicing blade. The width of the groove formation area 10 and the spot diameter of the laser beam may be different from each other, and the width of the dicing area 20 and the thickness of the dicing blade may be different from each other.

The scribe area 4Y has a configuration similar to the scribe area 4X except that the directions of the constituent elements such as the groove formation area 10, the dicing area 20, and the like and the arrangement of the monitor pads 5 are different. In the scribe area 4Y, three opening portions 146 are arranged in the X direction, and three monitor pads 5 are also arranged in the X direction. In the scribe area 4Y, a group of three columns of monitor pads 5 are arranged in the X direction. The scribe area 4Y includes: two groove formation areas 10 that overlap with the outermost columns of the group of three columns; and one dicing area 20 that overlaps with the central column of the group of three columns. The groove formation areas 10 and the dicing area 20 extend in the Y direction. The width of the groove formation area 10 is generally equal to the spot diameter of laser beam emitted later. The width of the dicing area 20 is generally equal to the thickness of the dicing blade. The width of the groove formation area 10 and the spot diameter of the laser beam may be different from each other, and the width of the dicing area 20 and the thickness of the dicing blade may be different from each other.

The semiconductor wafer 1 has the configuration as explained above.

With the semiconductor wafer 1 thus prepared, the electrical characteristics test using the monitor patterns is performed through the monitor pads 5.

Figure 3:
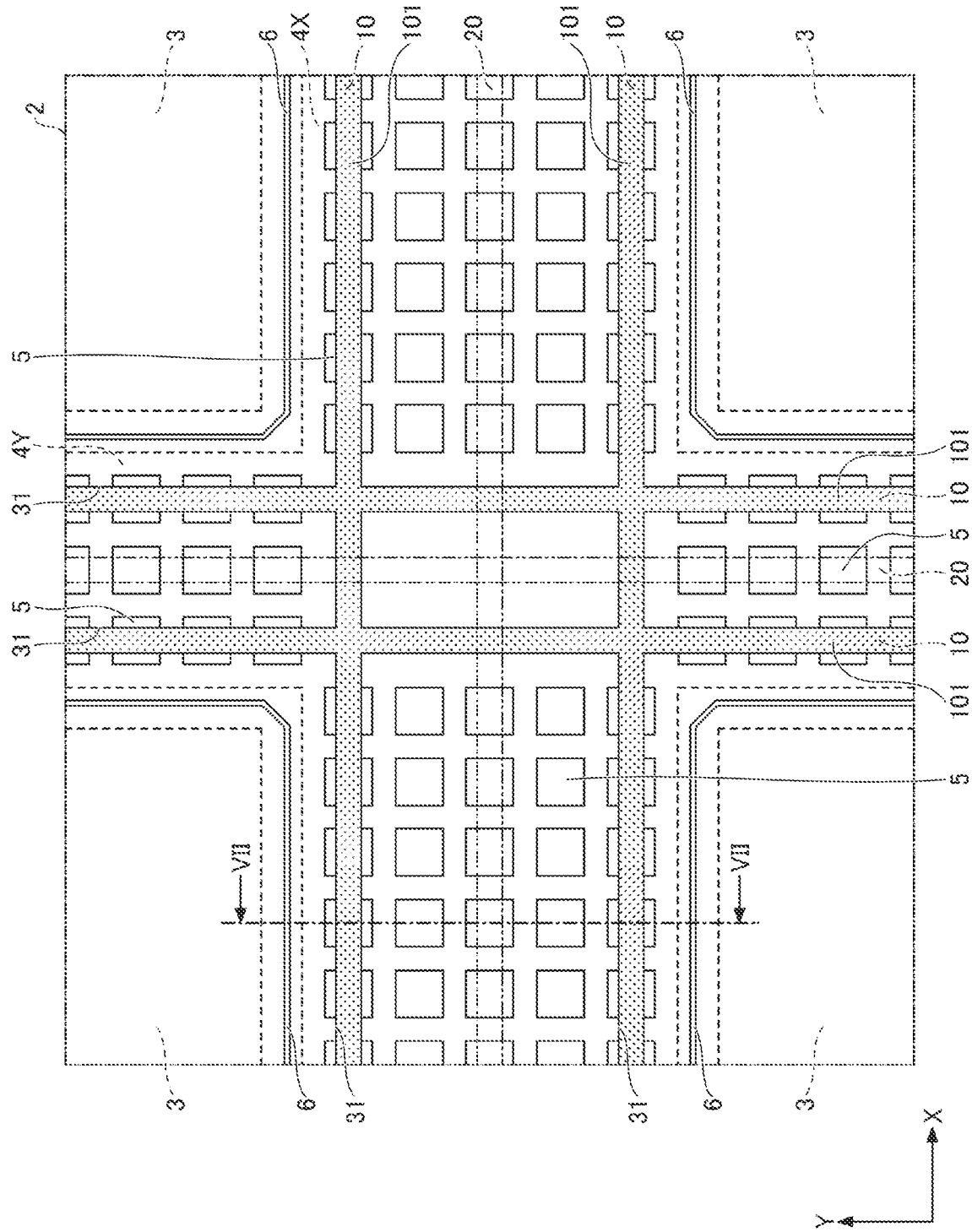
FIG. 3 is a schematic diagram (Part 2) illustrating the method for producing a semiconductor device according to the first embodiment.
Figure 7:
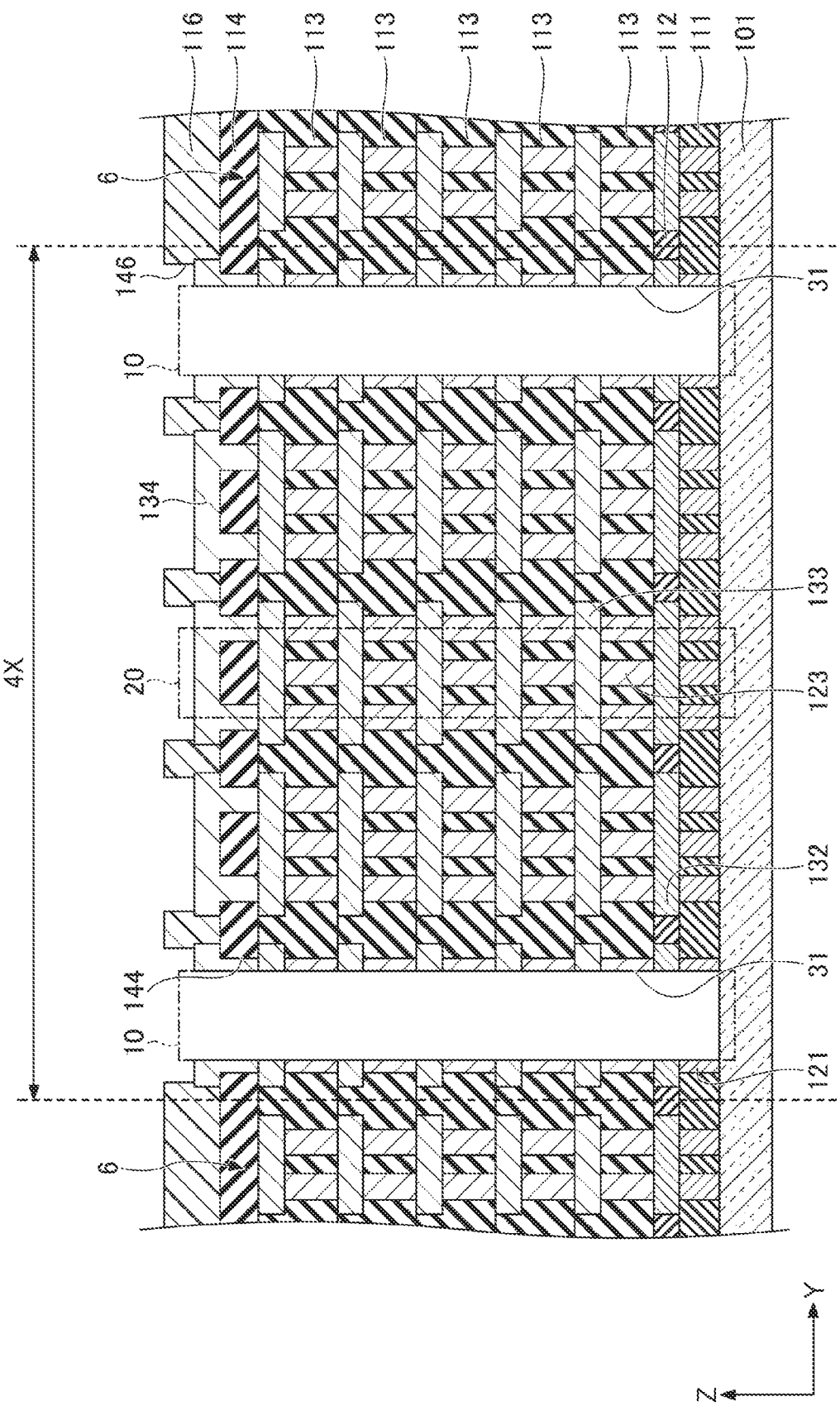
FIG. 7 is a cross-sectional view (Part 2) illustrating the method for producing a semiconductor device according to the first embodiment.

After the electrical characteristics test, as illustrated in FIG. 3 and FIG. 7, the monitor pads 5 (the conductive film 134) in the groove formation areas 10 are removed by emitting laser beam onto the groove formation areas 10. In the emission of the laser beam, further, on the lower side of the monitor pads 5, the conductive trace films 133, the vias 123, the third interlayer insulating films 113, the conductive trace film 132, the vias 121, the second interlayer insulating film 112, and the first interlayer insulating film 111 are removed. As a result, grooves 31 reaching the substrate 101 are formed. The front surface of the substrate 101 is exposed through the grooves 31.

Figure 4:
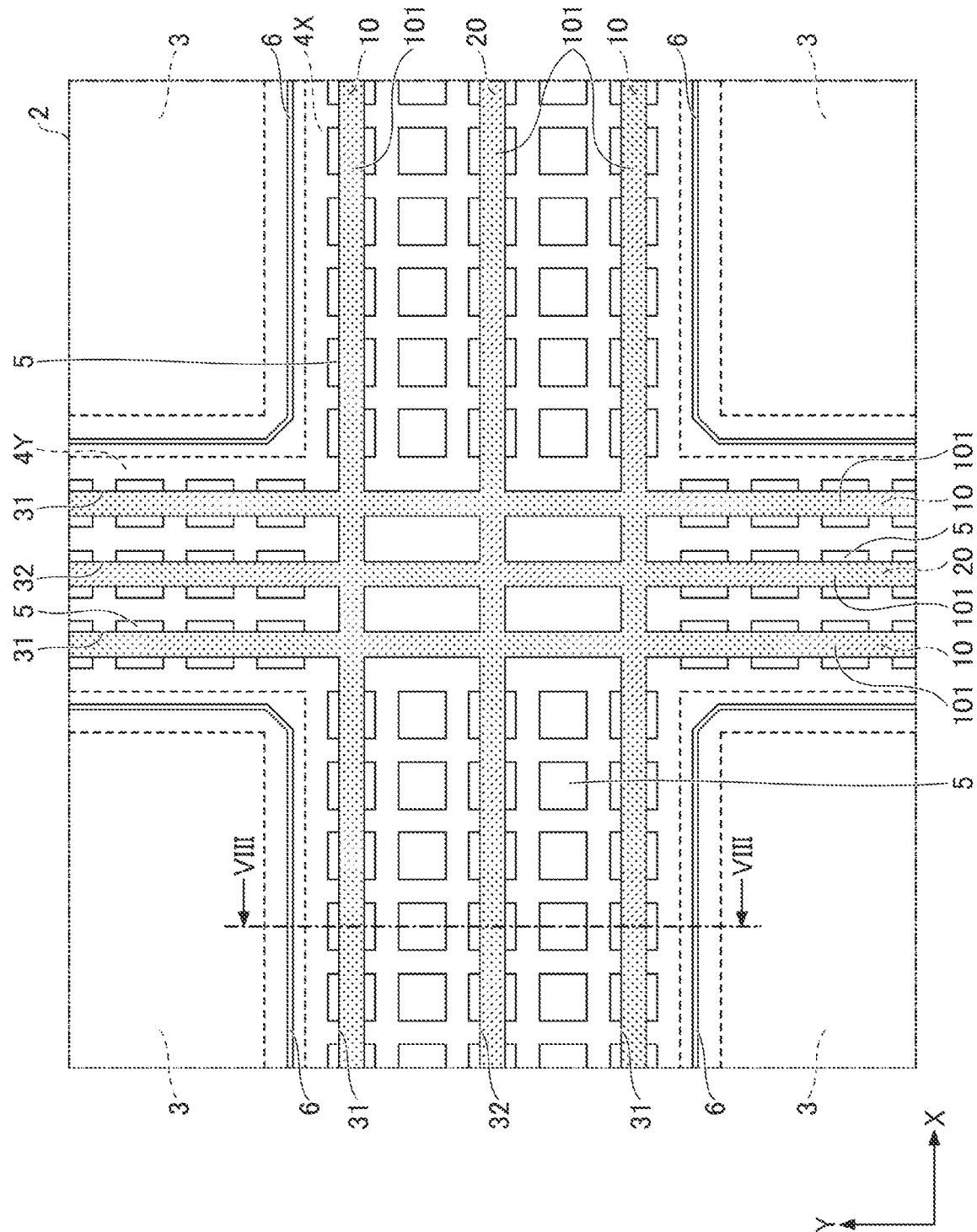
FIG. 4 is a schematic diagram (Part 3) illustrating the method for producing a semiconductor device according to the first embodiment.
Figure 8:
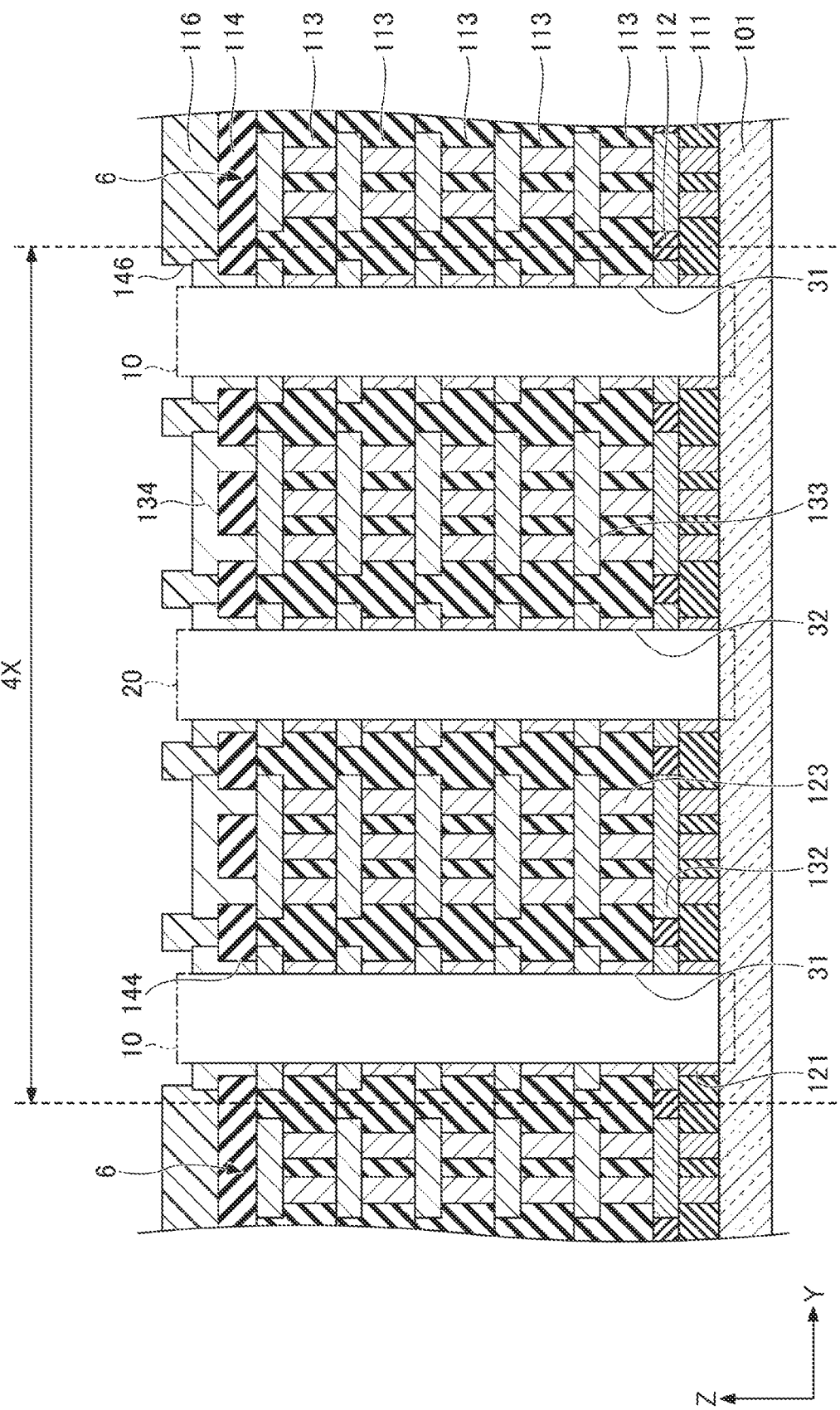
FIG. 8 is a cross-sectional view (Part 3) illustrating the method for producing a semiconductor device according to the first embodiment.

Next, as illustrated in FIG. 4 and FIG. 8, the monitor pads 5 (the conductive film 134), the conductive trace films 133, the vias 123, the third interlayer insulating films 113, the conductive trace film 132, the vias 121, the second interlayer insulating film 112, and the first interlayer insulating film 111 in the dicing area 20 are removed by emitting laser beam to the dicing area 20. As a result, the grooves 32 reaching the substrate 101 are formed in the dicing area 20. The front surface of the substrate 101 is exposed through the groove 32. The grooves 32 may be formed after the grooves 31 are formed. Alternatively, the grooves 31 may be formed after the grooves 32 are formed. Still alternatively, the grooves 31 and the grooves 32 may be formed in the same step.

Figure 5:
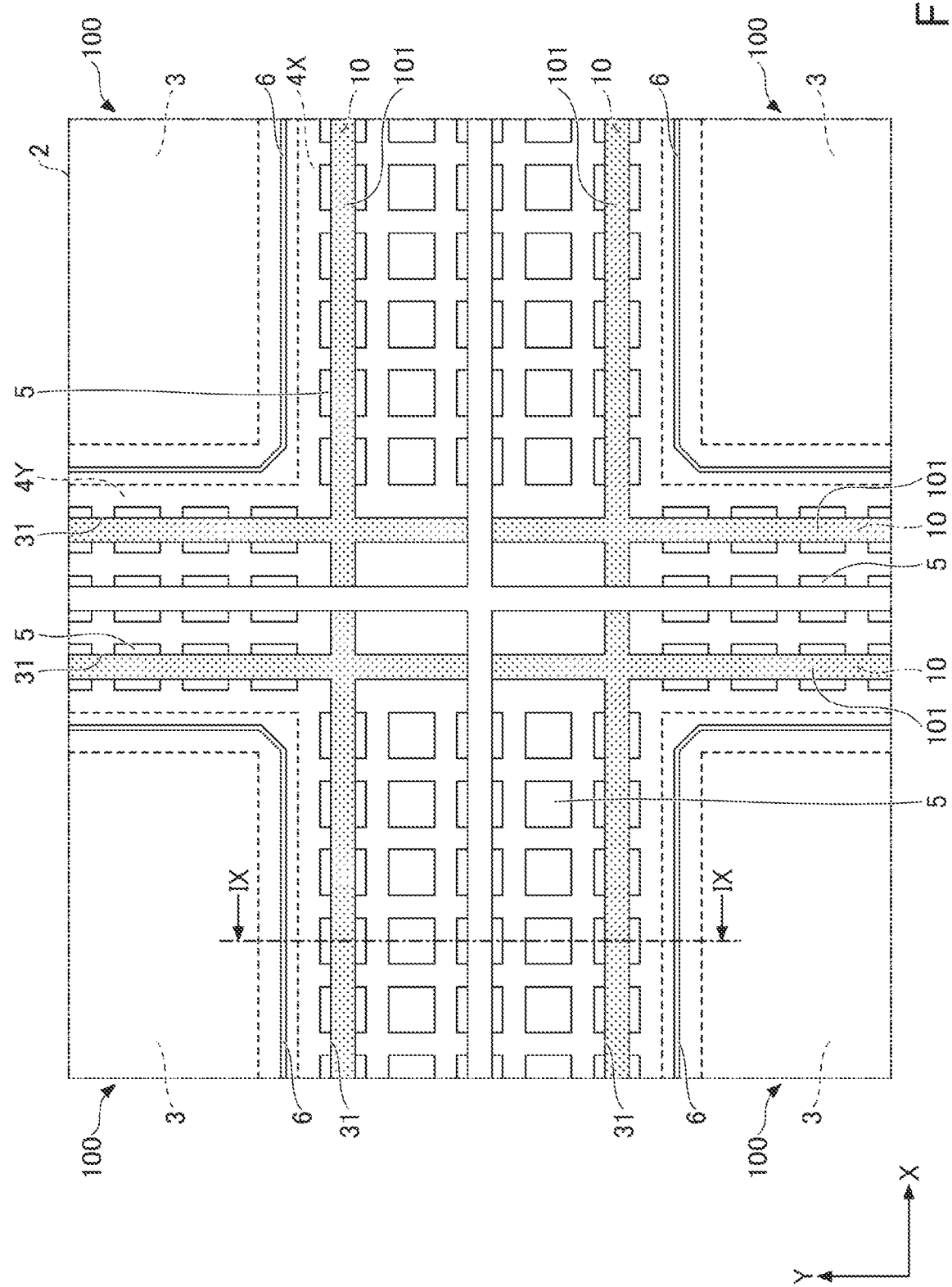
FIG. 5 is a schematic diagram (Part 4) illustrating the method for producing a semiconductor device according to the first embodiment.
Figure 9:
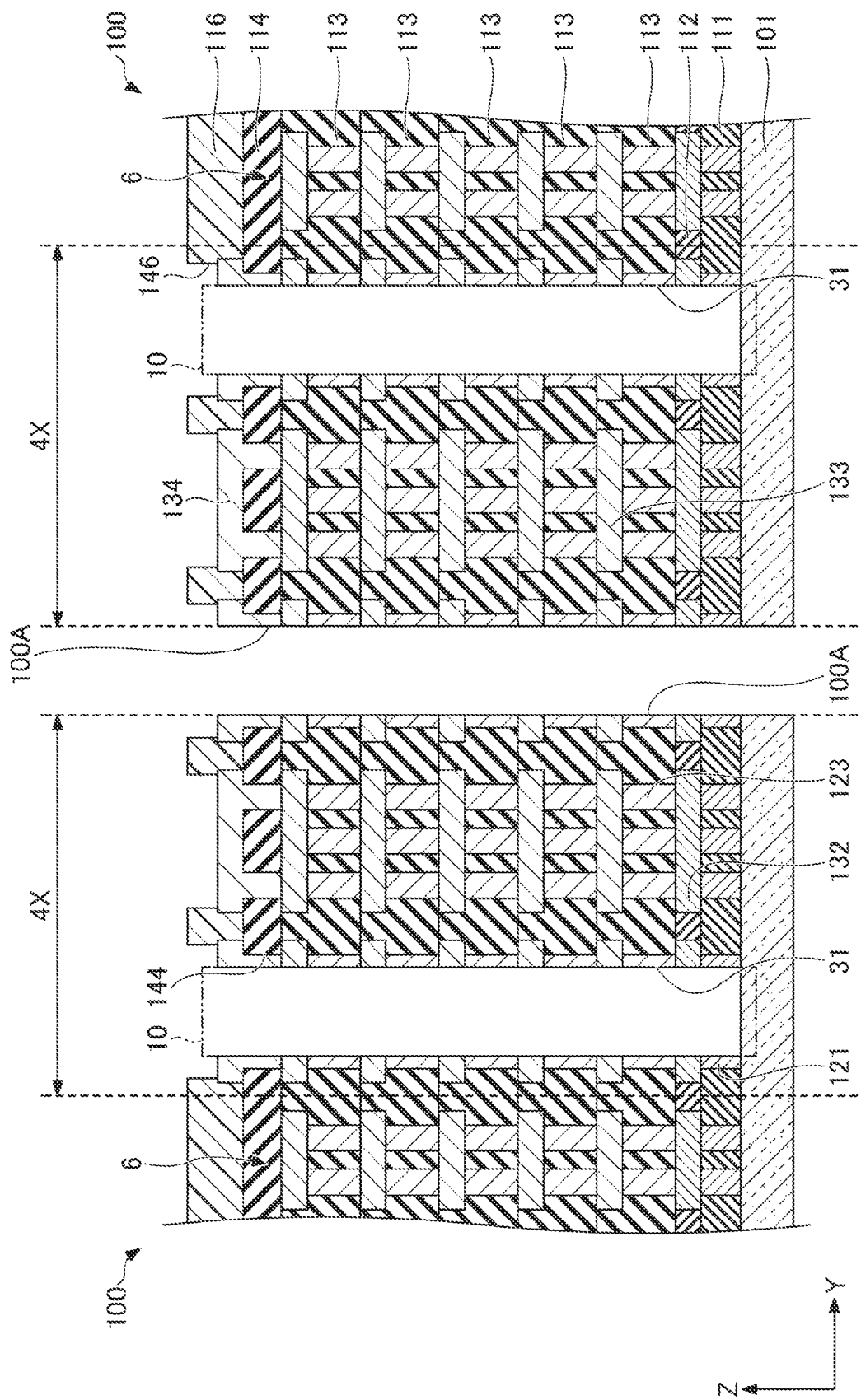
FIG. 9 is a cross-sectional view (Part 4) illustrating the method for producing a semiconductor device according to the first embodiment.

Thereafter, as illustrated in FIG. 5 and FIG. 9, the substrate 101 exposed through the grooves 32 is diced with a dicing blade and the like. The semiconductor wafer 1 is diced at the dicing areas 20 in the scribe areas 4X and 4Y by emitting laser beam to the dicing areas 20 and dicing the substrate 101 with the dicing blade and the like, and multiple semiconductor chips (i.e., a semiconductor device 100) including respective circuit areas 3 are formed. In other words, the semiconductor wafer 1 is diced into multiple semiconductor chips (the semiconductor device 100).

When the semiconductor wafer 1 is diced, a dicing blade having almost the same thickness as the width of the dicing area 20 is used, and the dicing area 20 is diced with the dicing blade. As a result, the dicing area 20 is eliminated, and multiple semiconductor chips are obtained as a semiconductor device 100.

Figure 10:
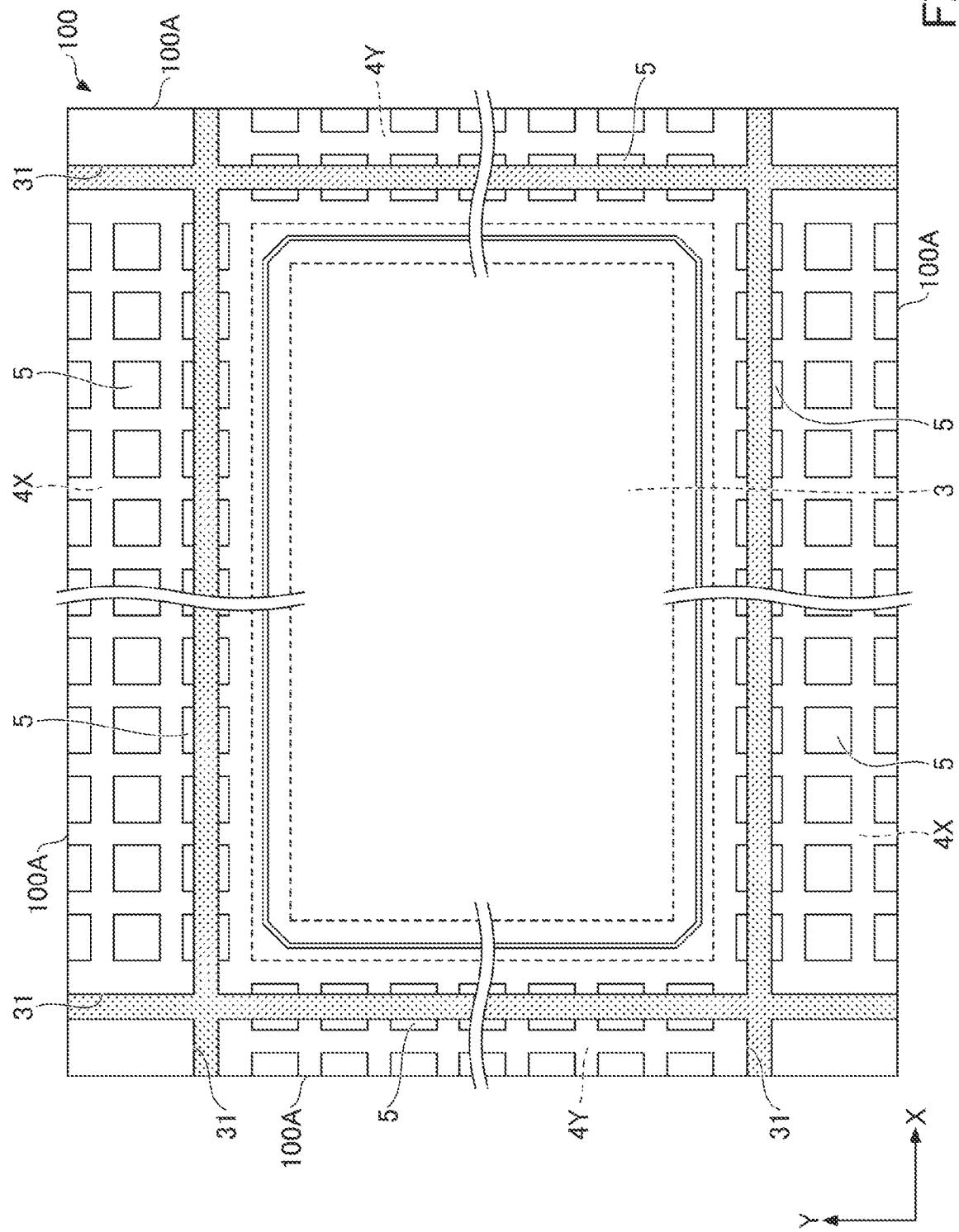
FIG. 10 is a drawing illustrating a layout of a diced semiconductor device according to the first embodiment.
Figure 11A:
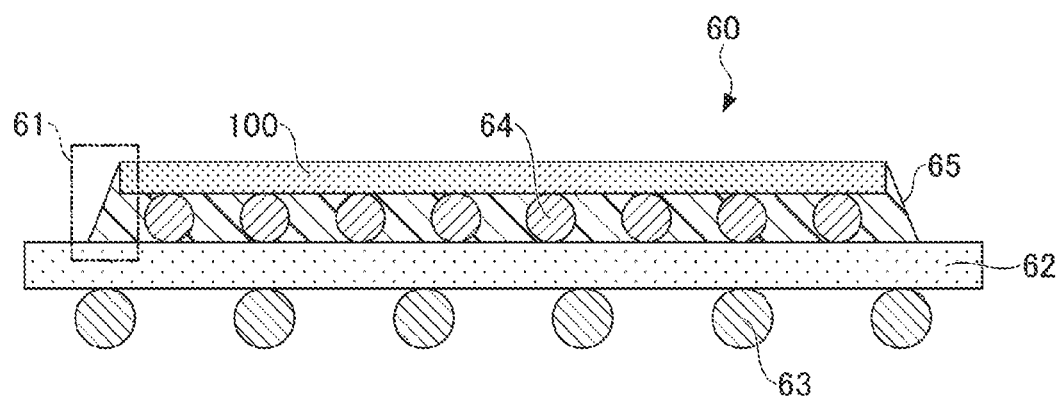
FIGS. 11A and 11B are cross-sectional views illustrating a semiconductor package having a semiconductor device.
Figure 11B:
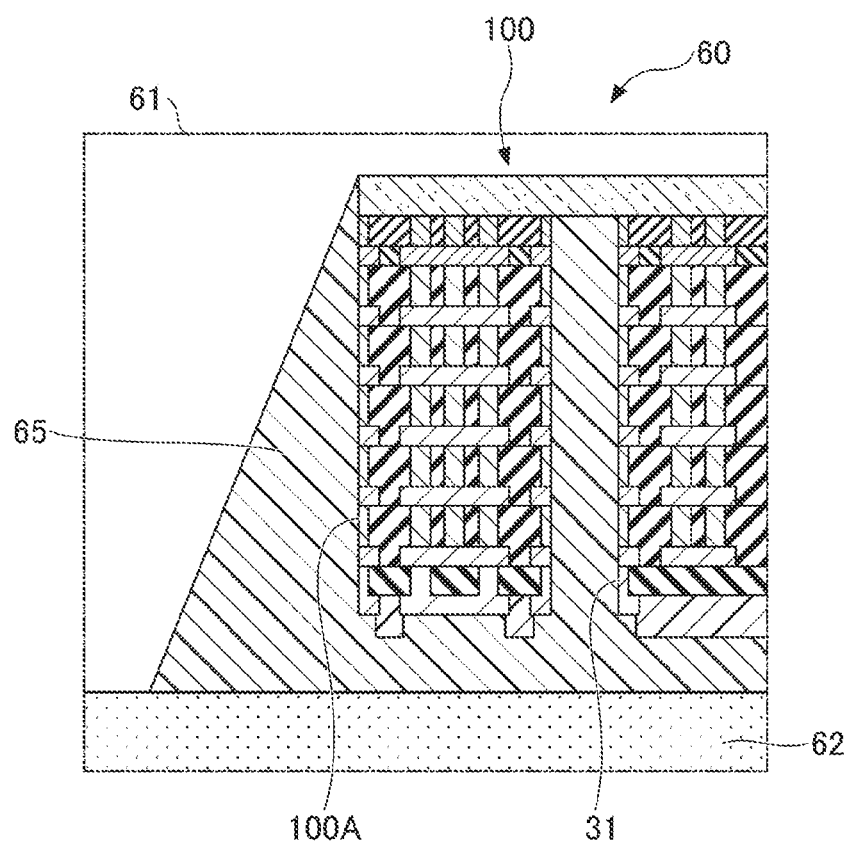

Hereinafter, the diced semiconductor device 100 and a semiconductor package including the semiconductor device 100 are explained. FIG. 10 is a drawing illustrating a layout of a diced semiconductor device according to the first embodiment. FIGS. 11A and 11B are cross-sectional views illustrating the semiconductor package including the semiconductor device. FIG. 11A illustrates the entire semiconductor package. FIG. 11B is an enlarged view of an area 61 that is a portion of FIG. 11A.

As illustrated in FIG. 10, the semiconductor device 100 includes a circuit area 3, the scribe areas 4X, and the scribe areas 4Y. The semiconductor device 100 has an outer peripheral surface 100A, and in the plan view, the scribe areas 4X and the scribe areas 4Y are located between the circuit area 3 and the outer peripheral surface 100A. Each of the scribe areas 4X and the scribe areas 4Y includes the groove formation area 10, and the grooves 31 are formed in the groove formation area 10. As illustrated in FIG. 9, in the groove 31, for example, the vias 121, the conductive trace film 132, the vias 123, the conductive trace films 133, and the conductive film 134 are exposed. In other words, portions of the conductive traces included in the conductive trace layers and portions of the monitor pads 5 are exposed through the grooves 31.

As illustrated in FIGS. 11A and 11B, a wiring substrate 62 provided with external terminals 63 is provided on the lower surface of a semiconductor package 60, and the semiconductor device 100 is flip-chip mounted on or over the wiring substrate 62 with a conductive material 64 such as a solder. An underfill 65 is filled as an insulating film between the wiring substrate 62 and the semiconductor device 100. The underfill 65 is also provided in the grooves 31. The underfill 65 may cover outer peripheral surfaces 100A of the semiconductor device 100.

In the semiconductor package 60, the adhesion property between the underfill 65 and the substrate 101 is higher than the adhesion property between the adhesion property between the underfill 65 and the monitor pad 5. Therefore, the peeling is less likely to occur between the semiconductor device 100 and the underfill 65 than in a case where the entire monitor pads 5 are remaining in the groove formation area 10.

Also, when the substrate 101 is diced (see FIG. 5 and FIG. 9), a crack may occur in the conductive film 134, the conductive trace films 133, the vias 123, the third interlayer insulating films 113, the conductive trace film 132, or the vias 121, but even if the crack occurs, the extension of the crack can be stopped at the grooves 31. Therefore, the circuit area 3 can be protected from cracks.

The width of the dicing area 20 does not have to be the same as the thickness of the dicing blade. Also, it is not necessary to eliminate the entire dicing area 20, and after the substrate 101 is diced with the dicing blade, portions of the dicing area 20 may be remaining. In this case, portions of the monitor pads 5 (the conductive film 134) in the dicing area 20 may be remaining.

The vias 123 may have a single damascene structure. In this case, the via 123 includes a film such as tungsten (W), ruthenium (Ru), molybdenum (Mo), or cobalt (Co) and an underlayer film such as titanium (Ti) or titanium nitride (TiN) formed under this film.

Second Embodiment

Figure 12:
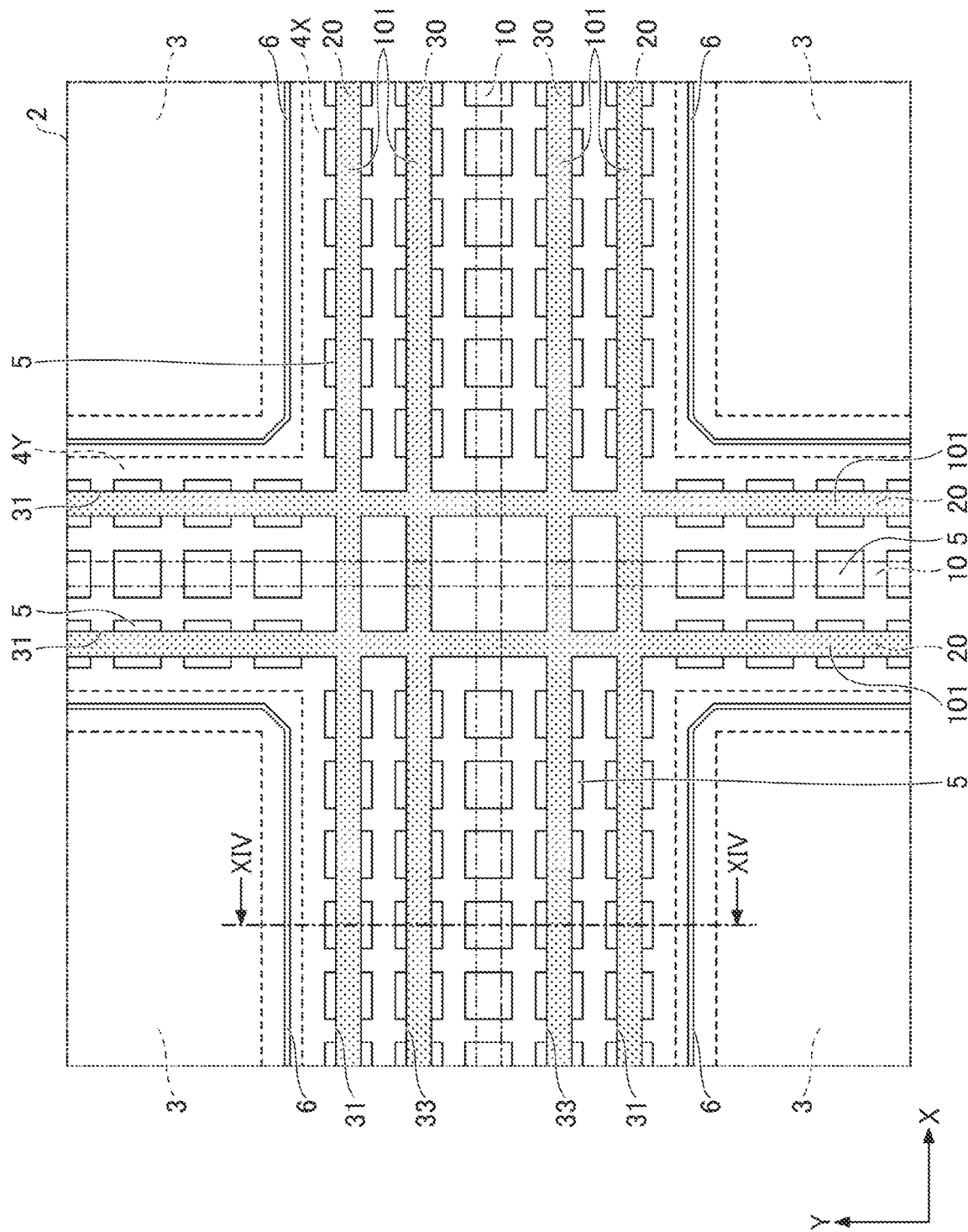
FIG. 12 is a schematic diagram (Part 1) illustrating a method for producing a semiconductor device according to a second embodiment.
Figure 13:
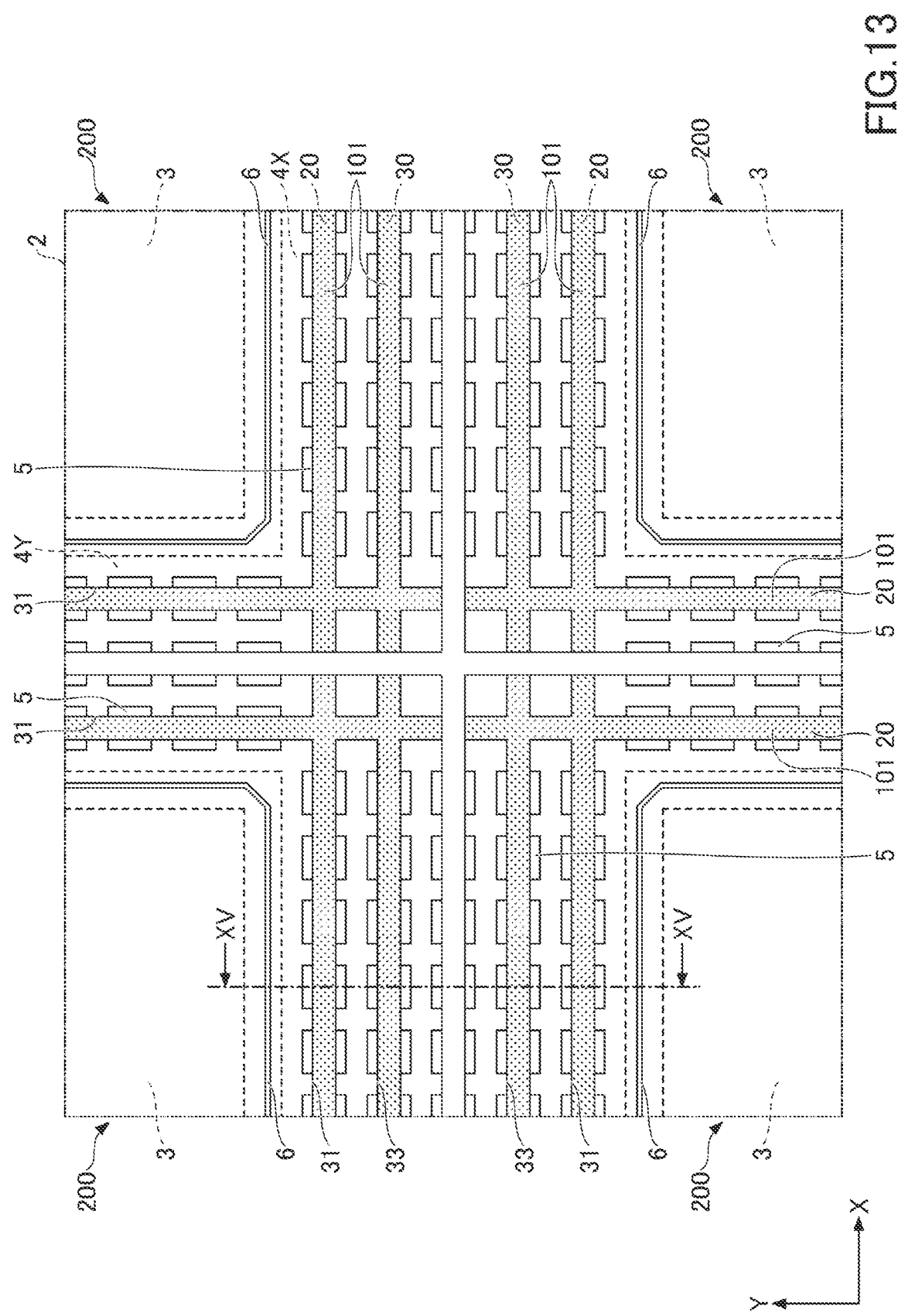
FIG. 13 is a schematic diagram (Part 2) illustrating the method for producing a semiconductor device according to the second embodiment.
Figure 14:
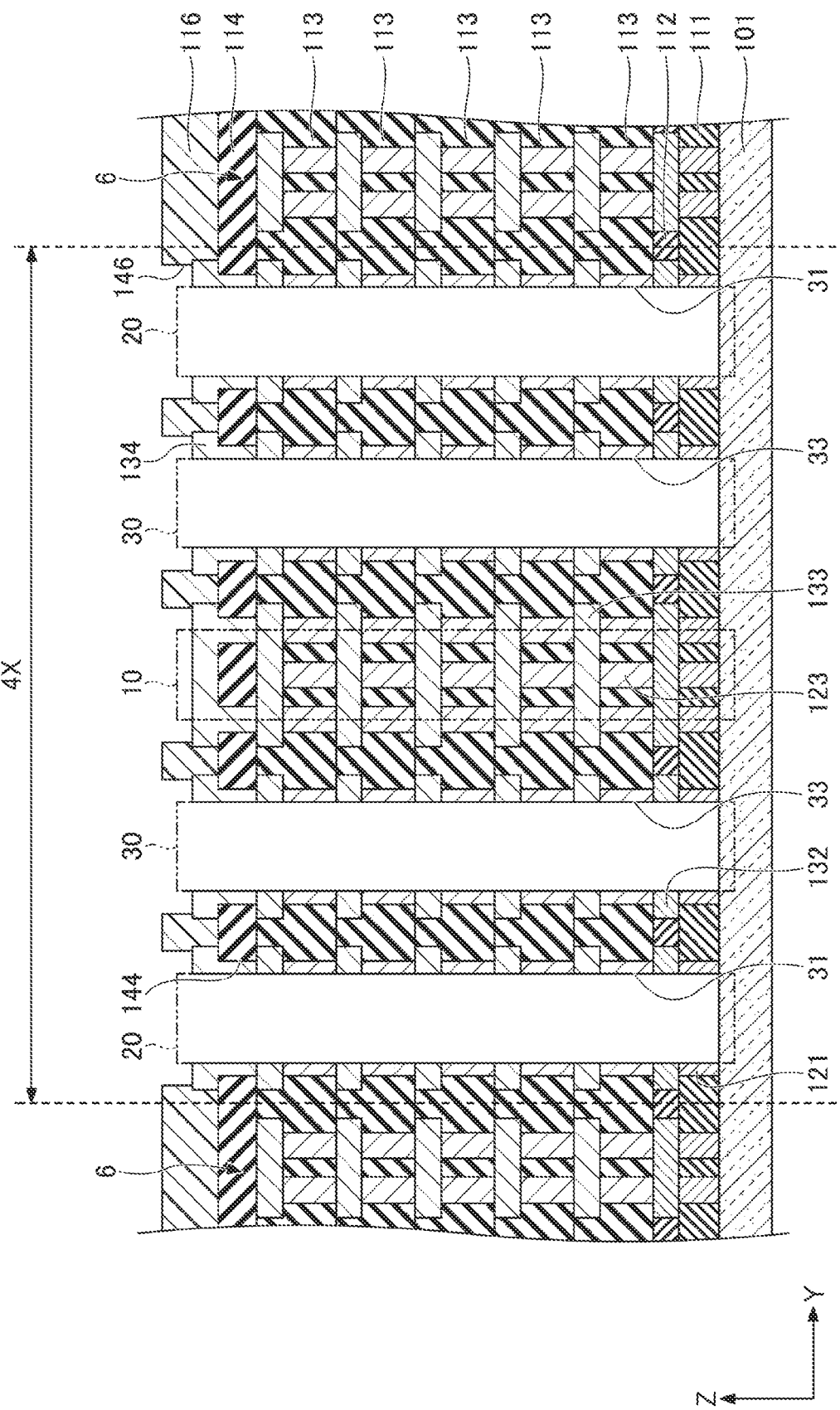
FIG. 14 is a cross-sectional view (Part 1) illustrating the method for producing a semiconductor device according to the second embodiment.
Figure 15:
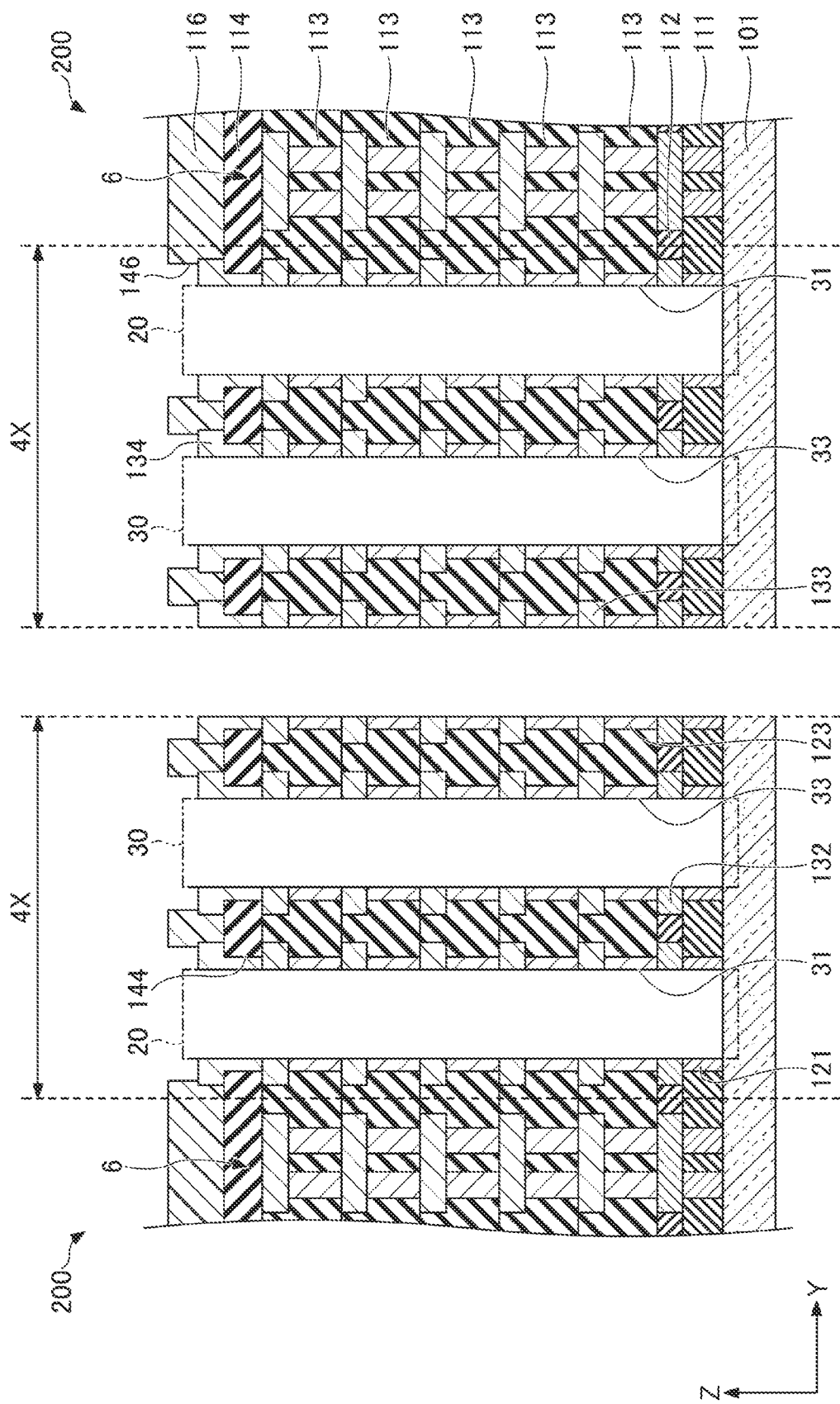
FIG. 15 is a cross-sectional view (Part 2) illustrating the method for producing a semiconductor device according to the second embodiment.

Subsequently, the second embodiment is explained. The second embodiment is different from the first embodiment mainly in the processing of the scribe area 4X. FIG. 12 to FIG. 13 are schematic diagrams illustrating a method for producing a semiconductor device according to the second embodiment. FIG. 14 to FIG. 15 are cross-sectional views illustrating the method for producing a semiconductor device according to the second embodiment. FIG. 12 to FIG. 13 are enlarged drawings illustrating an area 2 that is a portion of FIG. 1. FIG. 14 to FIG. 15 correspond to cross-sectional views taken along line XIV-XIV to line XV-XV of FIG. 12 to FIG. 13, respectively.

In the second embodiment, first, similarly to the first embodiment, the semiconductor wafer 1 is prepared (FIG. 2 and FIG. 6), and an electrical characteristics test is performed. Subsequently, as illustrated in FIG. 12 and FIG. 14, the monitor pads 5 (the conductive film 134) in dicing areas 10 are removed by emitting laser beam onto the dicing areas 10. Further, the monitor pads 5 (the conductive film 134) in second groove formation areas 30 are removed by emitting laser beam onto the second groove formation areas 30 between the dicing area 10 and first groove formation areas 20. In the scribe area 4X, the second groove formation areas 30 overlap with the outermost rows and the central row of the group of five rows of monitor pads 5, and the second groove formation areas 30 extend in the X direction. The width of the second groove formation area 30 is generally equal to the spot diameter of laser beam emitted later. In the emission of the laser beam, further, on the lower side of the monitor pads 5, the conductive trace films 133, the vias 123, the third interlayer insulating films 113, the conductive trace film 132, the vias 121, the second interlayer insulating film 112, and the first interlayer insulating film 111 are removed. As a result, in the first groove formation areas 20, grooves 31 reaching the substrate 101 are formed, and in the second groove formation areas 30, grooves 33 reaching the substrate 101 are formed. The front surface of the substrate 101 is exposed through the grooves 31 and 33. The width of the second groove formation area 30 and the spot diameter of the laser beam may be different from each other. The order in which the grooves 31, 32, and 33 are formed is not limited, and the grooves 31, 32, and 33 may be formed in any order.

Thereafter, as illustrated in FIG. 13 and FIG. 15, similarly to the first embodiment, the monitor pads 5 (the conductive film 134) in the dicing areas 10 are removed by emitting laser beam onto the dicing areas 10, and the substrate 101 exposed through the grooves 32 is diced with a dicing blade and the like. The semiconductor wafer 1 is diced at the dicing areas 10 in the scribe areas 4X and 4Y by emitting laser beam to the dicing areas 10 and dicing the substrate 101 with the dicing blade and the like, and a semiconductor device 200 (i.e., multiple semiconductor chips) including respective circuit areas 3 is formed. In other words, the semiconductor wafer 1 is diced into multiple semiconductor chips (i.e., the semiconductor device 200).

In a case where a semiconductor package 60 is produced by using the semiconductor device 200, the underfill 65 is provided not only in the grooves 31 but also in the grooves 33.

According to the second embodiment, the contact area between the underfill 65 and the monitor pads 5 is reduced more greatly, and accordingly, a higher adhesion property between the semiconductor device 200 and the underfill 65 is obtained, and the peeling between the semiconductor device 200 and the underfill 65 can be alleviated more reliably.

Third Embodiment

Figure 16:
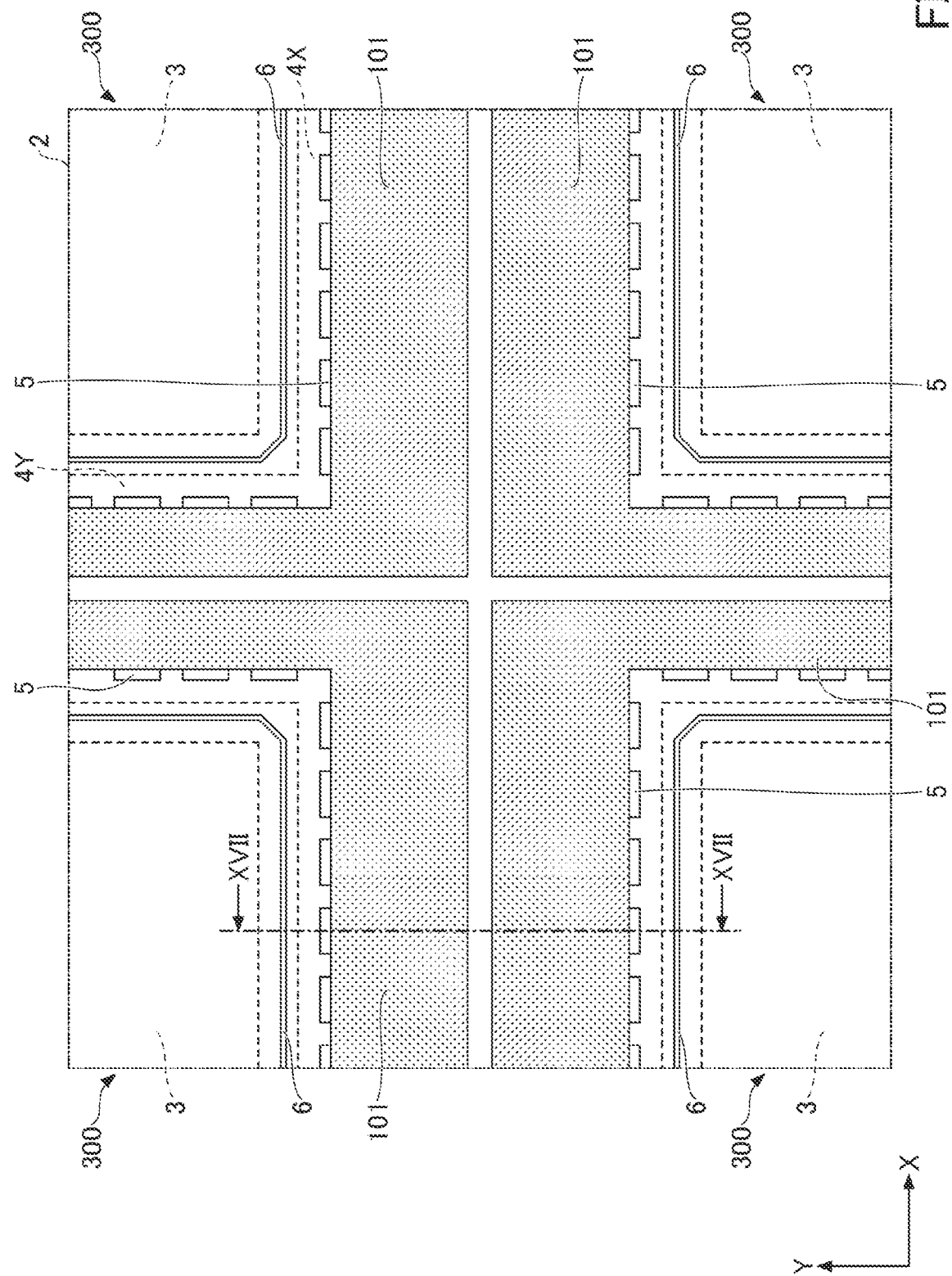
FIG. 16 is a schematic diagram illustrating a method for producing a semiconductor device according to a third embodiment.
Figure 17:
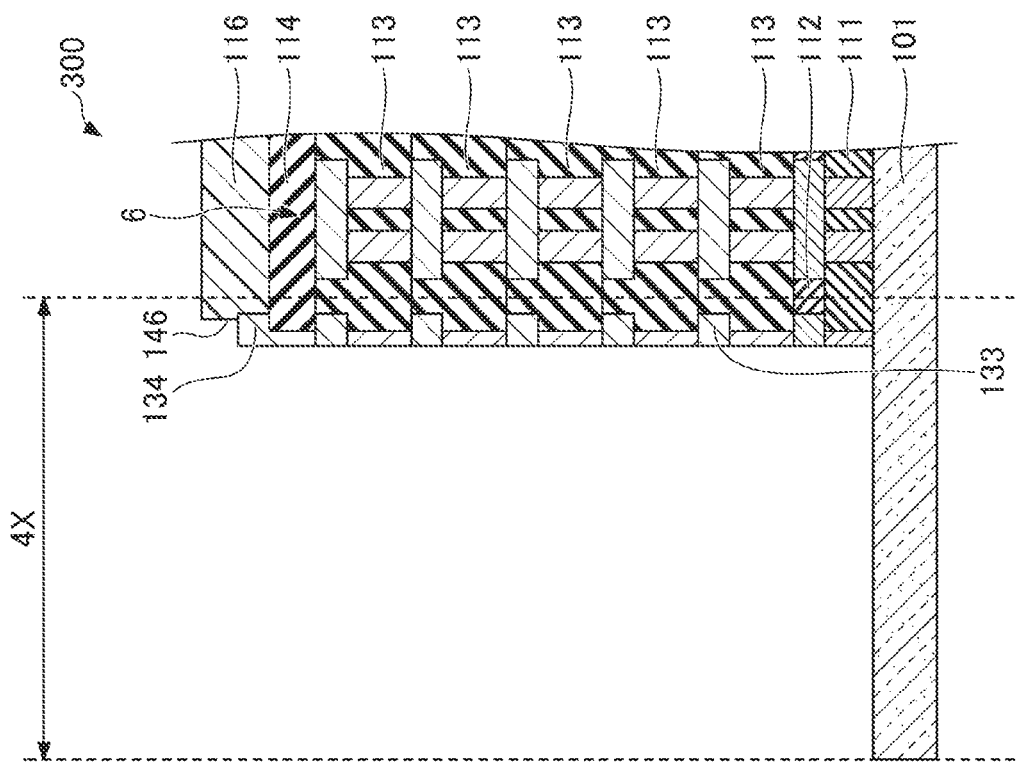
FIG. 17 is a cross-sectional view illustrating a method for producing a semiconductor device according to the third embodiment.

Subsequently, the third embodiment is explained. The third embodiment is different from the first embodiment and the like mainly in the processing of the scribe areas 4X and 4Y. FIG. 16 is a schematic diagram illustrating a method for producing a semiconductor device according to the third embodiment. FIG. 17 is a cross-sectional view illustrating a method for producing a semiconductor device according to the third embodiment. FIG. 16 is an enlarged drawing illustrating an area 2 that is a portion of FIG. 1. FIG. 17 corresponds to a cross-sectional view taken along line XVI to line XVI of FIG. 16.

In the third embodiment, first, similarly to the first embodiment, the semiconductor wafer 1 is prepared (FIG. 2 and FIG. 6), and electrical characteristics test is performed. Subsequently, as illustrated in FIG. 16 and FIG. 17, the monitor pads 5 (the conductive film 134), the conductive trace films 133, the vias 123, the third interlayer insulating films 113, the conductive trace film 132, the vias 121, the second interlayer insulating film 112, and the first interlayer insulating film 111 are removed in the groove formation areas 10, the dicing area 20, and areas between the groove formation areas 10 and the dicing area 20 by emitting laser beam onto these areas. In these areas, the front surface of the substrate 101 is exposed.

Thereafter, similarly to the first embodiment, the substrate 101 is diced in the dicing areas 20 with the dicing blade and the like. The semiconductor wafer 1 is diced at the dicing areas 20 in the scribe areas 4X and 4Y by emitting laser beam to the dicing area 20 and dicing the substrate 101 with the dicing blade and the like, and a semiconductor device 300 (i.e., multiple semiconductor chips) including respective circuit areas 3 are formed. In other words, the semiconductor wafer 1 is diced into multiple semiconductor chips (i.e., the semiconductor device 300).

In a case where the semiconductor package 60 is produced by using the semiconductor device 300, the underfill 65 is provided so as to be in contact with the entire exposed front surface of the substrate 101.

According to the third embodiment, the contact area between the underfill 65 and the monitor pads 5 is reduced more greatly, and accordingly, a higher adhesion property between the semiconductor device 300 and the underfill 65 is obtained, and the peeling between the semiconductor device 300 and the underfill 65 can be alleviated more reliably.

Fourth Embodiment

Figure 18:
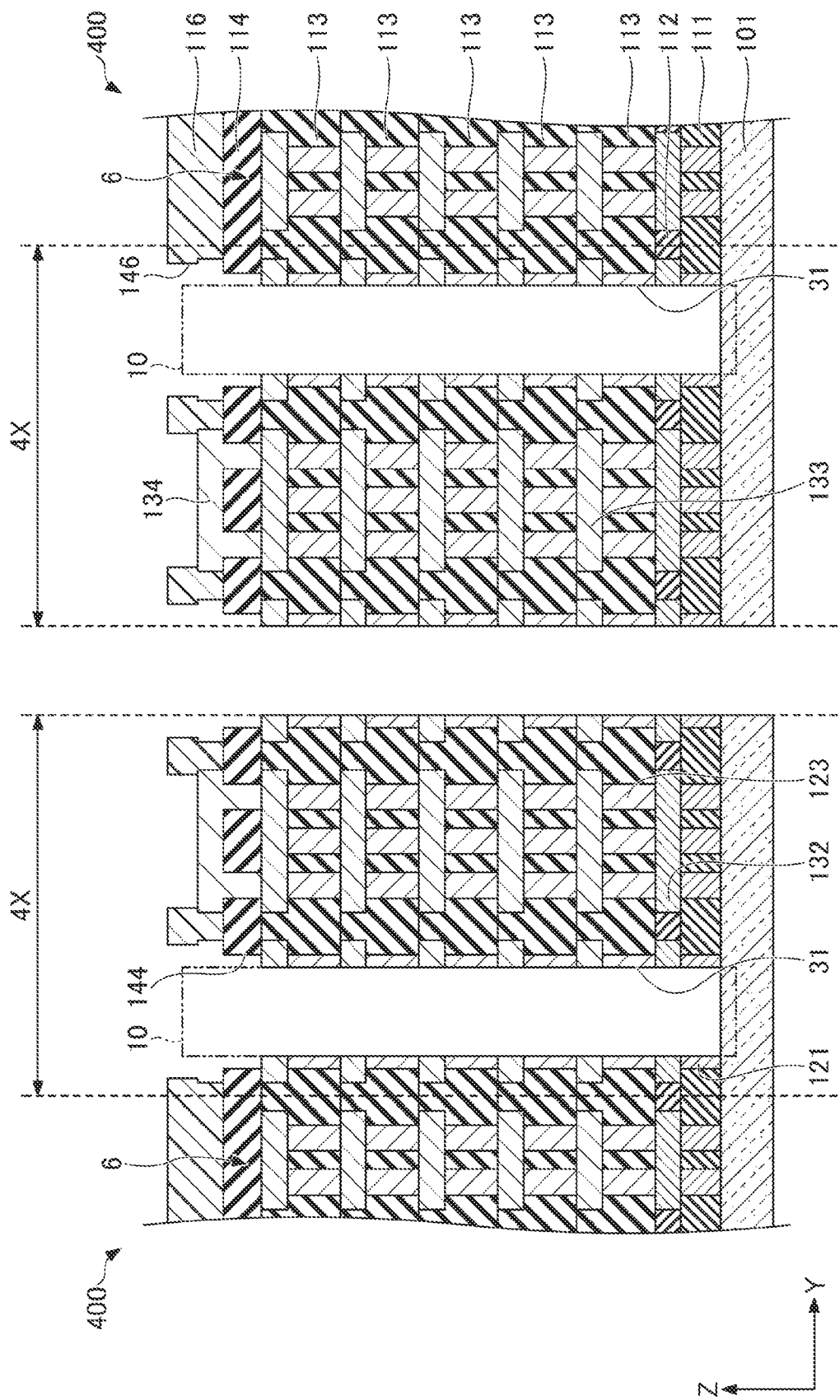
FIG. 18 is a cross-sectional view illustrating a method for producing a semiconductor device according to a fourth embodiment.

Subsequently, the fourth embodiment is explained. The fourth embodiment is different from the first embodiment and the like mainly in the processing of the scribe area 4X. FIG. 18 is a cross-sectional view illustrating a method for producing a semiconductor device according to the fourth embodiment.

In the fourth embodiment, as illustrated in FIG. 18, when laser beam is emitted onto the groove formation areas 10, the entire monitor pads 5 overlapping with the groove formation areas 10 are removed. The entire monitor pads 5 can be removed by, for example, adjusting the emission position of laser beam and adjusting the beam diameter. The configuration other than the above is similar to the first embodiment. According to the fourth embodiment, multiple semiconductor chips (i.e., a semiconductor device 400) are obtained.

According to the fourth embodiment, the contact area between the underfill 65 and the monitor pads 5 is reduced more greatly, and accordingly, a higher adhesion property between the semiconductor device 400 and the underfill 65 is obtained, and the peeling between the semiconductor device 400 and the underfill 65 can be alleviated more reliably.

The entirety of the conductive trace films 133, the vias 123, the conductive trace film 132, and the vias 121 under the monitor pads 5, the entirety of which has been removed, may be removed.

Fifth Embodiment

Figure 19:
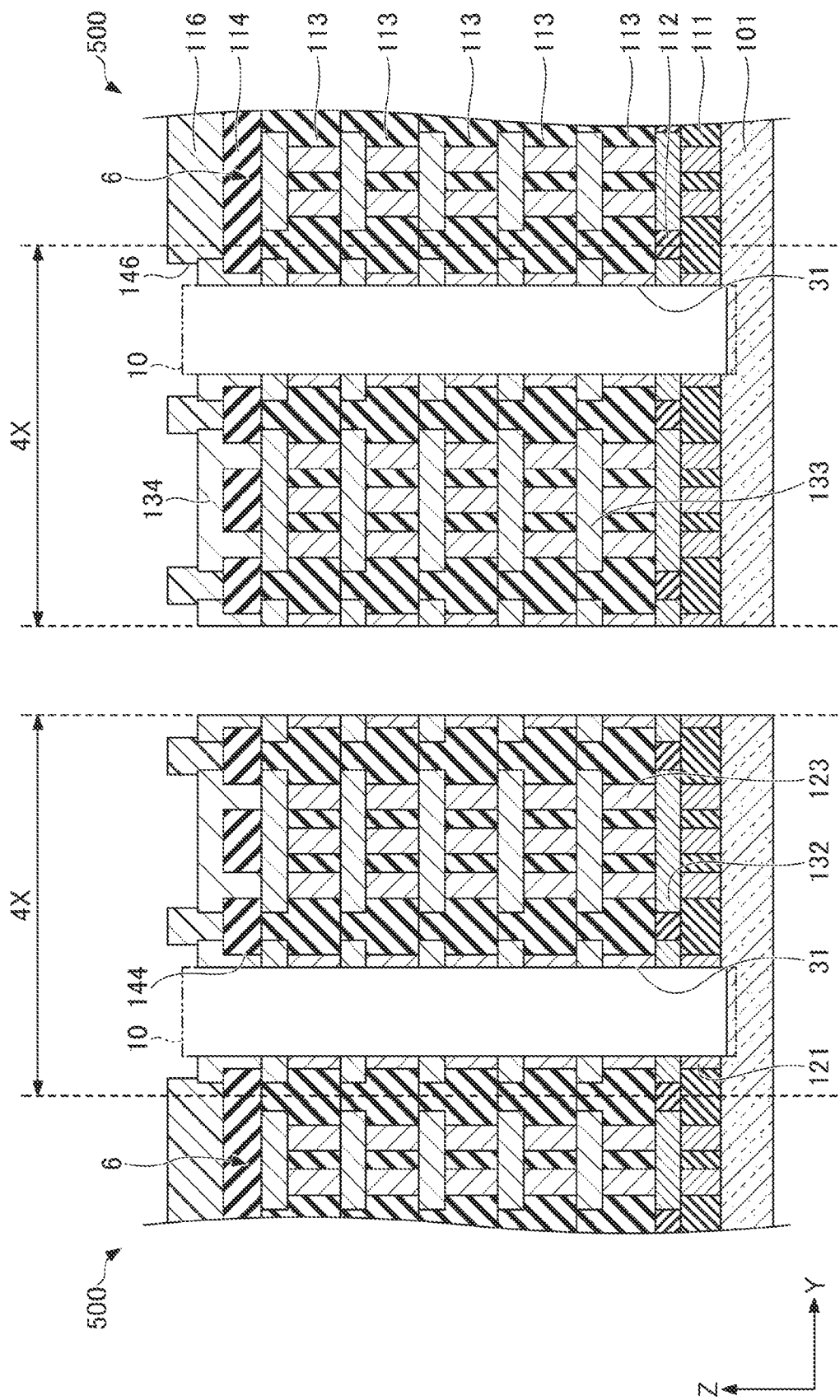
FIG. 19 is a cross-sectional view illustrating a method for producing a semiconductor device according to a fifth embodiment.

Subsequently, the fifth embodiment is explained. The fifth embodiment is different from the first embodiment and the like mainly in the processing of the scribe areas 4X and 4Y. FIG. 19 is a cross-sectional view illustrating a method for producing a semiconductor device according to the fifth embodiment.

In the fifth embodiment, when the grooves 31 are formed, laser beam is emitted with energy greater than the first embodiment. Accordingly, as illustrated in FIG. 19, the grooves 31 extend into the substrate 101. The configuration other than the above is similar to the first embodiment. According to the fifth embodiment, multiple semiconductor chips (i.e., a semiconductor device 500) are obtained.

According to the fifth embodiment, effects similar to the first embodiment can also be obtained.

Sixth Embodiment

Figure 20:
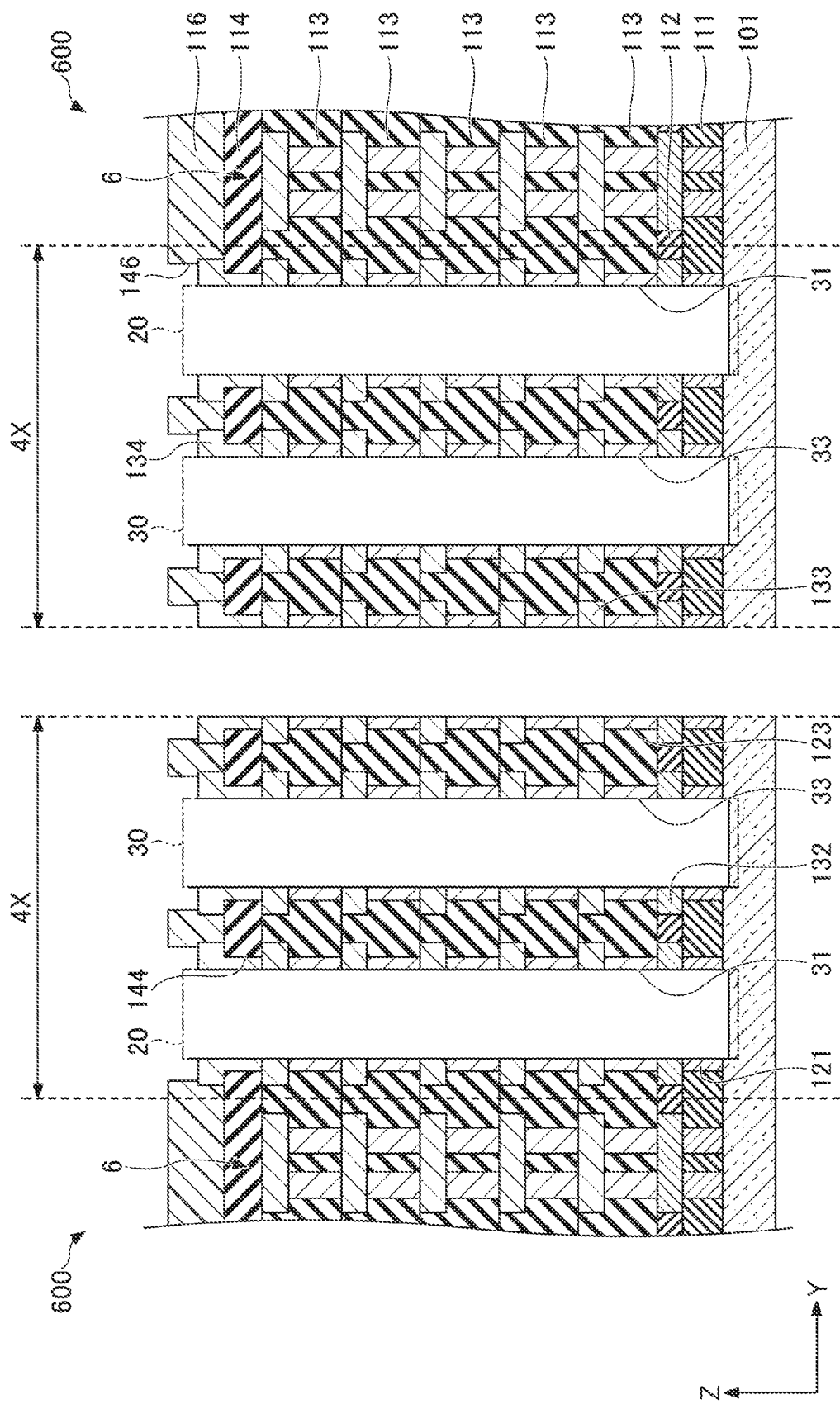
FIG. 20 is a cross-sectional view illustrating a method for producing a semiconductor device according to a sixth embodiment.

Subsequently, the sixth embodiment is explained. The sixth embodiment is different from the second embodiment and the like mainly in the processing of the scribe areas 4X and 4Y. FIG. 20 is a cross-sectional view illustrating a method for producing a semiconductor device according to the sixth embodiment.

In the sixth embodiment, when grooves 31 are formed, laser beam is emitted with energy greater than the first embodiment. Also, when the grooves 33 are formed, laser beam is emitted with energy greater than the second embodiment. For example, when the grooves 31 are formed, laser beam may be emitted with energy greater than the energy used to form the grooves 33. Accordingly, as illustrated in FIG. 20, the grooves 31 and 33 extend into the substrate 101. The grooves 31 extend into the substrate 101 more deeply than the grooves 33. The configuration other than the above is similar to the second embodiment. According to the sixth embodiment, multiple semiconductor chips (i.e., a semiconductor device 600) are obtained.

According to the sixth embodiment, effects similar to the second embodiment can also be obtained.

Seventh Embodiment

Figure 21:
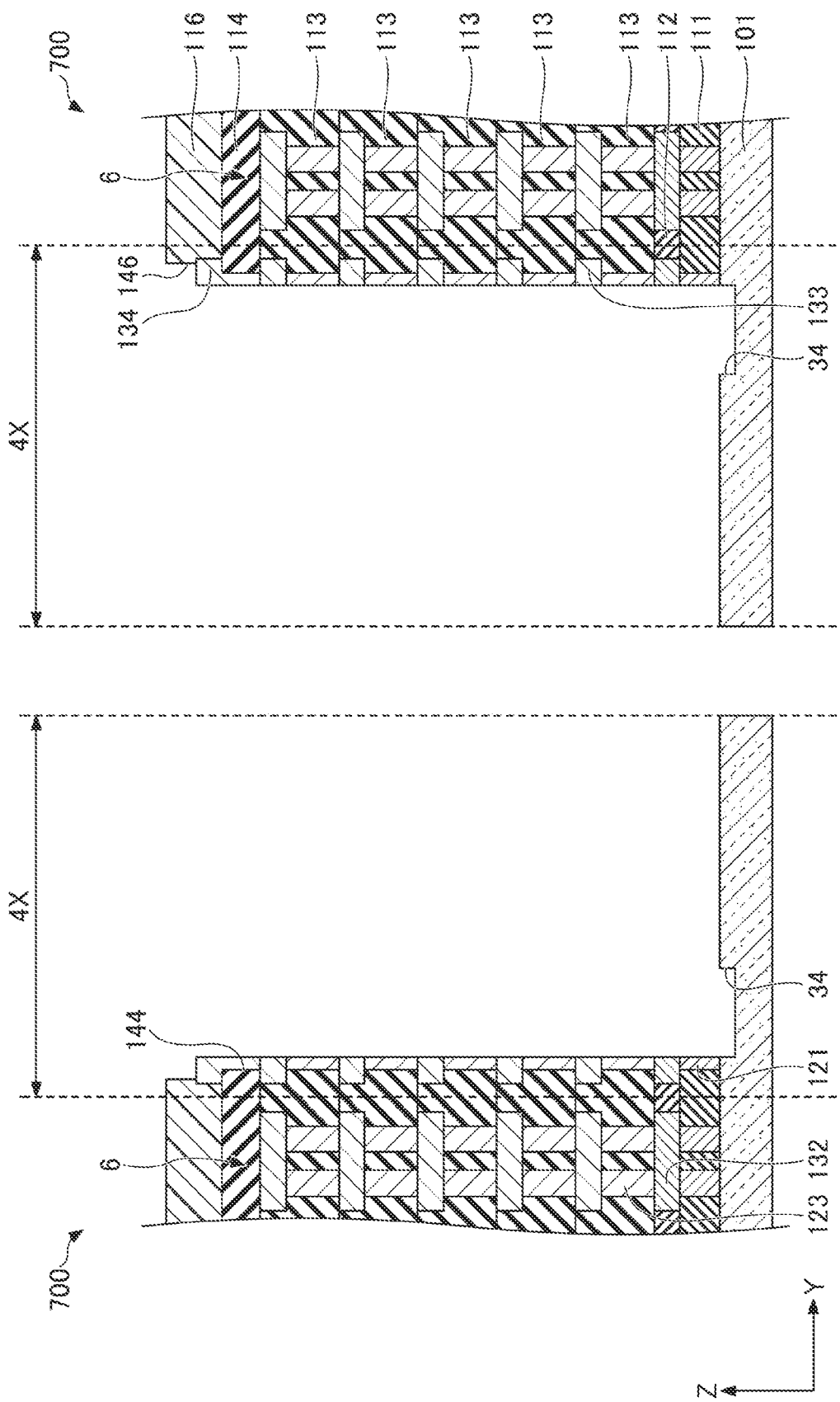
FIG. 21 is a cross-sectional view illustrating a method for producing a semiconductor device according to a seventh embodiment.

Subsequently, the seventh embodiment is explained. The seventh embodiment is different from the third embodiment and the like mainly in the processing of the scribe areas 4X and 4Y. FIG. 21 is a cross-sectional view illustrating a method for producing a semiconductor device according to the seventh embodiment.

In the seventh embodiment, the monitor pads 5 (the conductive film 134), the conductive trace films 133, the vias 123, the third interlayer insulating films 113, the conductive trace film 132, the vias 121, the second interlayer insulating film 112, and the first interlayer insulating film 111 are removed in the groove formation areas 10, the dicing area 20, and areas between the groove formation areas 10 and the dicing area 20 by emitting laser beam onto these areas with energy greater than the third embodiment. Accordingly, as illustrated in FIG. 21, the front surface of the substrate 101 is engraved more deeply than the front surface covered with the first interlayer insulating film 111 and the like. In the present embodiment, the energy is configured to be relatively greater in the groove formation area 10 in particular. As a result, grooves 34 are formed in the exposed front surface of the substrate 101. The configuration other than the above is similar to the third embodiment. According to the seventh embodiment, multiple semiconductor chips (i.e., a semiconductor device 700) are obtained.

According to the seventh embodiment, effects similar to the third embodiment can also be obtained.

In any of the above embodiments, the number of monitor pads provided in the scribe areas 4X and 4Y is not particularly limited.

According to the present disclosure, the peeling of the underfill can be alleviated.

Although the present invention has been described above with reference to the embodiments, the present invention is not limited to the features described in the embodiments. These features can be changed without departing from the scope of the claimed subject matter, and can be appropriately determined according to the implementation to which the present invention is applied.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method for producing a semiconductor device, the method comprising:
    removing a first pad located in a first area of a first scribe area of a semiconductor wafer by emitting laser beam along a first direction, the first scribe area extending in the first direction in a plan view, the first area extending in the first direction in a plan view; and
    dicing a second area of the first scribe area of the semiconductor wafer after removing the first pad, the wafer including a circuit area, the second area extending in the first direction in a plan view, and the first area being located between the second area and the circuit area in a second direction which is different from the first direction in a plan view,
wherein the first area of the first scribe area is separated from the second area of the first scribe area in a plan view.

2. The method for producing a semiconductor device according to claim 1, wherein
a second pad is located in the first area, and
the second pad is located nearer to the second area than the first pad in the first area in a plan view.

3. The method for producing a semiconductor device according to claim 2, further comprising:
removing the second pad by emitting laser beam along the first direction before dicing the second area.

4. The method for producing a semiconductor device according to claim 2, wherein the first pad is removed and the second pad remains after emitting laser beam.

5. The method for producing a semiconductor device according to claim 1, wherein
the semiconductor wafer includes a substrate;
the semiconductor wafer includes a conductive trace layer between the substrate and the first pad; and
in removing the first pad, a first groove is formed.

6. The method for producing a semiconductor device according to claim 5, wherein
the first groove reaches the substrate.

7. The method for producing a semiconductor device according to claim 1, further comprising
removing a third pad located in a third area of a second scribe area of the semiconductor wafer by emitting laser beam along the second direction, the second scribe area extending in the second direction in a plan view, the third area extending in the second direction in a plan view; and
dicing a fourth area of the second scribe area of the semiconductor wafer after removing the third pad, the fourth area extending in the second direction in a plan view, the third area being located between the fourth area and the circuit area in the first direction in a plan view.

8. The method for producing a semiconductor device according to claim 7, wherein
the semiconductor wafer includes a substrate;
the semiconductor wafer includes a conductive trace layer between the substrate, and the first pad and the third pad;
in removing of the first pad, a first groove is formed; and
in removing of the third pad, a second groove is formed.

9. The method for producing a semiconductor device according to claim 8, wherein
the first groove is connected to the second groove.

10. The method for producing a semiconductor device according to claim 9, wherein
the first groove reaches the substrate, and
the second groove reaches the substrate.

11. A method for producing a semiconductor device, the method comprising:
forming a first groove in a first area of a first scribe area of a semiconductor wafer by emitting laser beam along a first direction in a plan view, the first scribe area extending in the first direction in a plan view, the first area extending in the first direction in a plan view; and
dicing a second area of the first scribe area of the semiconductor wafer after forming the first groove, the second area extending in the first direction in a plan view, the first area being located between the second area and a circuit area of the semiconductor wafer in a second direction which is different from the first direction in a plan view,
wherein,
the semiconductor wafer includes a substrate and an interlayer insulating film on the substrate,
the first groove is formed in the interlayer insulating film, and
the second area is separated from the first groove in a plan view.

12. The method for producing a semiconductor device according to claim 11, wherein
a first pad is formed on the interlayer insulating film in the first area, and
in forming the first groove, the first pad is removed.

13. The method for producing a semiconductor device according to claim 11, further comprising:
forming a second groove in a third area of a second scribe area of the semiconductor wafer and in the interlayer insulating film by emitting laser beam along a second direction which is different from the first direction in a plan view, the second scribe area extending in the second direction in a plan view, the third area extending in the second direction in a plan view; and
dicing a fourth area of the second scribe area of the semiconductor wafer after forming the second groove, the fourth area extending in the second direction in a plan view, the third area being located between the fourth area and the circuit area in the first direction in a plan view,
wherein,
the second groove is formed in the interlayer insulating film.

14. The method for producing a semiconductor device according to claim 13, wherein the first groove is connected to the second groove.

15. The method for producing a semiconductor device according to claim 13, further comprising:
forming a third groove in a fifth area of a third scribe area of the semiconductor wafer by emitting laser beam along the first direction in a plan view, the third scribe area extending in the first direction in a plan view, the fifth area extending in the first direction in a plan view; and
dicing a sixth area of the third scribe area of the semiconductor wafer after forming the third groove, the sixth area extending in the first direction in a plan view, the fifth area being located between the sixth area and the circuit area in the second direction in a plan view,
wherein
the circuit area is located between the third scribe area and the first scribe area in the second direction in a plan view, and
the third groove is formed in the interlayer insulating film.

16. The method for producing a semiconductor device according to claim 15, further comprising:
forming a fourth groove in a seventh area of a fourth scribe area of the semiconductor wafer by emitting laser beam along the second direction in a plan view, the fourth scribe area extending in the second direction in a plan view, the seventh area extending in the second direction in a plan view; and
dicing an eighth area of the fourth scribe area of the semiconductor wafer after forming the fourth groove, the eighth area extending in the second direction in a plan view, the seventh area being located between the eighth area and the circuit area in the first direction in a plan view, wherein the circuit area is located between the second scribe area and the fourth scribe area in the first direction in a plan view, and the fourth groove is formed in the interlayer insulating film.

17. The method for producing a semiconductor device according to claim 16, wherein:

the first groove is connected to the second groove and the fourth groove, and the third groove is connected to the second groove and the fourth groove.

18. The method for producing a semiconductor device according to claim 17, wherein the circuit area is surrounded by the first groove, the second groove, the third groove and the fourth groove in a plan view.

19. The method for producing a semiconductor device according to claim 18, wherein the first groove reaches the substrate,
the second groove reaches the substrate,
the third groove reaches the substrate, and
the fourth groove reaches the substrate.

\* \* \* \* \*